US010867889B2

(12) United States Patent
Fang et al.

(10) Patent No.: US 10,867,889 B2
(45) Date of Patent: Dec. 15, 2020

(54) METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Li-Yen Fang, Tainan (TW); Chih-Chang Huang, Chiayi (TW); Jung-Chih Tsao, Tainan (TW); Yao-Hsiang Liang, Hsinchu (TW); Yu-Ku Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/123,527

(22) Filed: Sep. 6, 2018

(65) Prior Publication Data

US 2019/0019743 A1 Jan. 17, 2019

Related U.S. Application Data

(62) Division of application No. 14/689,707, filed on Apr. 17, 2015, now Pat. No. 10,074,594.

(51) Int. Cl.
*H01L 23/48* (2006.01)
*H01L 23/532* (2006.01)
*H01L 21/768* (2006.01)
*H01L 25/065* (2006.01)
*H01L 27/146* (2006.01)
*H01L 25/10* (2006.01)

(52) U.S. Cl.
CPC ...... *H01L 23/481* (2013.01); *H01L 21/76898* (2013.01); *H01L 23/53238* (2013.01); *H01L 25/0657* (2013.01); *H01L 25/10* (2013.01); *H01L 27/14636* (2013.01); *H01L 27/14687* (2013.01); *H01L 2224/16145* (2013.01); *H01L 2224/16225* (2013.01); *H01L 2924/15311* (2013.01)

(58) Field of Classification Search
CPC ........... H01L 23/5226; H01L 21/76898; H01L 23/481; H01L 25/0657; H01L 23/49827; H01L 23/53238; H01L 23/53295; H01L 21/76886; H01L 21/2885; H01L 21/76877; H01L 23/53223; H01L 2924/0002
See application file for complete search history.

(56) References Cited

U.S. PATENT DOCUMENTS

2014/0021633 A1* 1/2014 Lee ................. H01L 23/481
257/774
2014/0042032 A1* 2/2014 Shimoyama ............ C25D 5/18
205/118

* cited by examiner

*Primary Examiner* — Mohammed R Alam
(74) *Attorney, Agent, or Firm* — WPAT, P.C., Intellectual Property Attorneys; Anthony King

(57) ABSTRACT

A method of manufacturing a semiconductor structure includes receiving a substrate including a first side and a second side opposite to the first side; forming a recess extending between the first side and the second side; and disposing a conductive material in the recess to form a conductive via, wherein the conductive via includes an interface, a first portion adjacent to the first side and a second portion adjacent to the second side, the interface is disposed between the first portion and the second portion, an average grain size of the first portion is substantially different from an average grain size of the second portion.

20 Claims, 18 Drawing Sheets

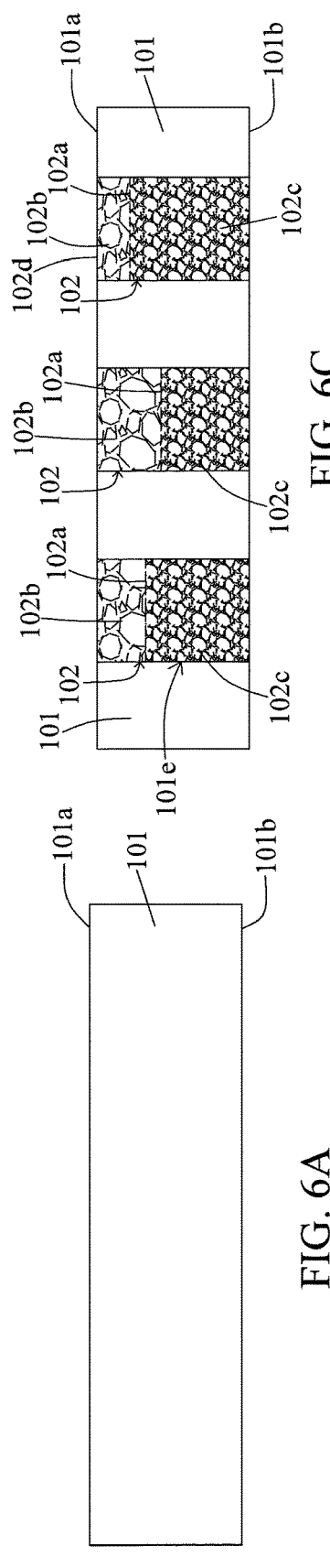

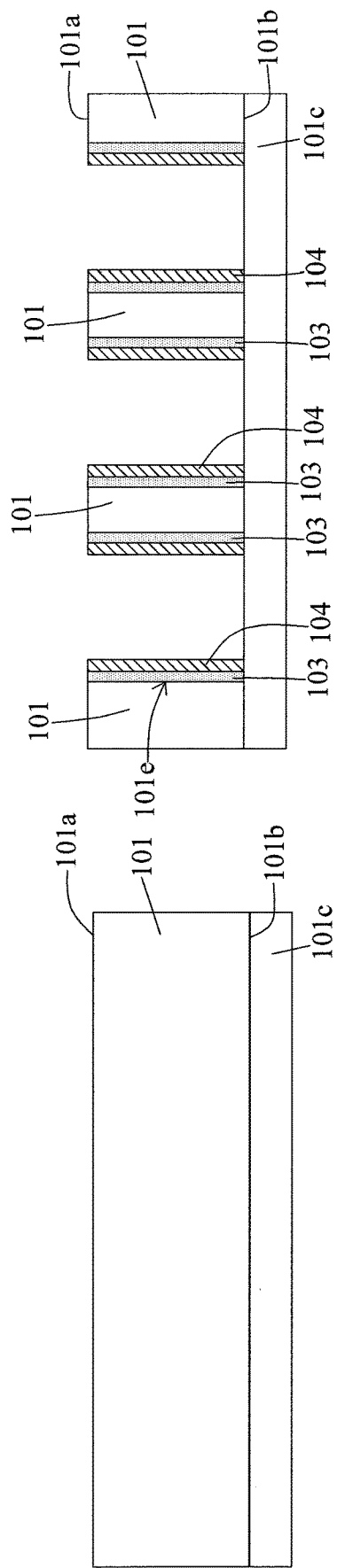
FIG. 7A
FIG. 7B
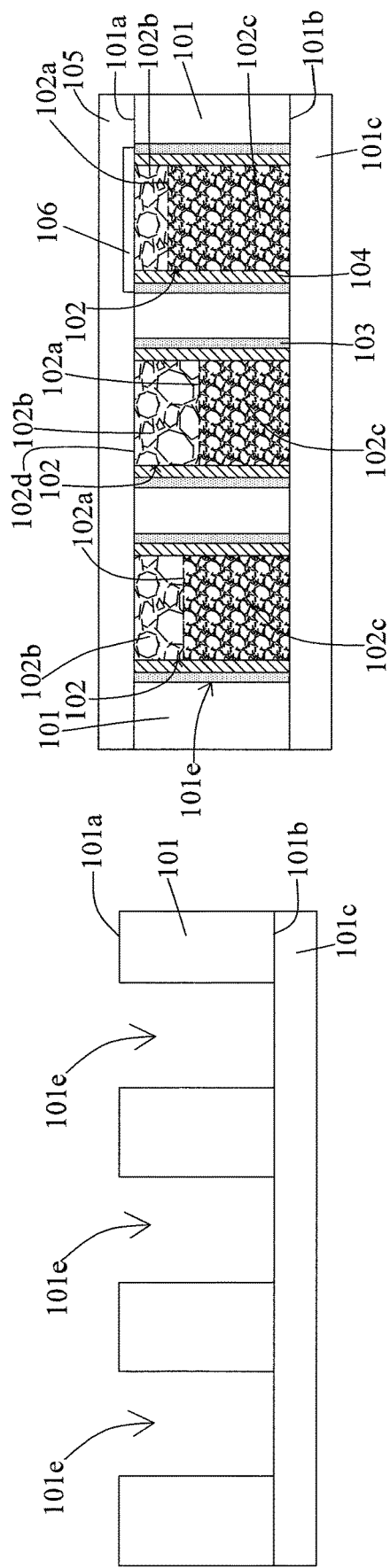
FIG. 7C
FIG. 7D

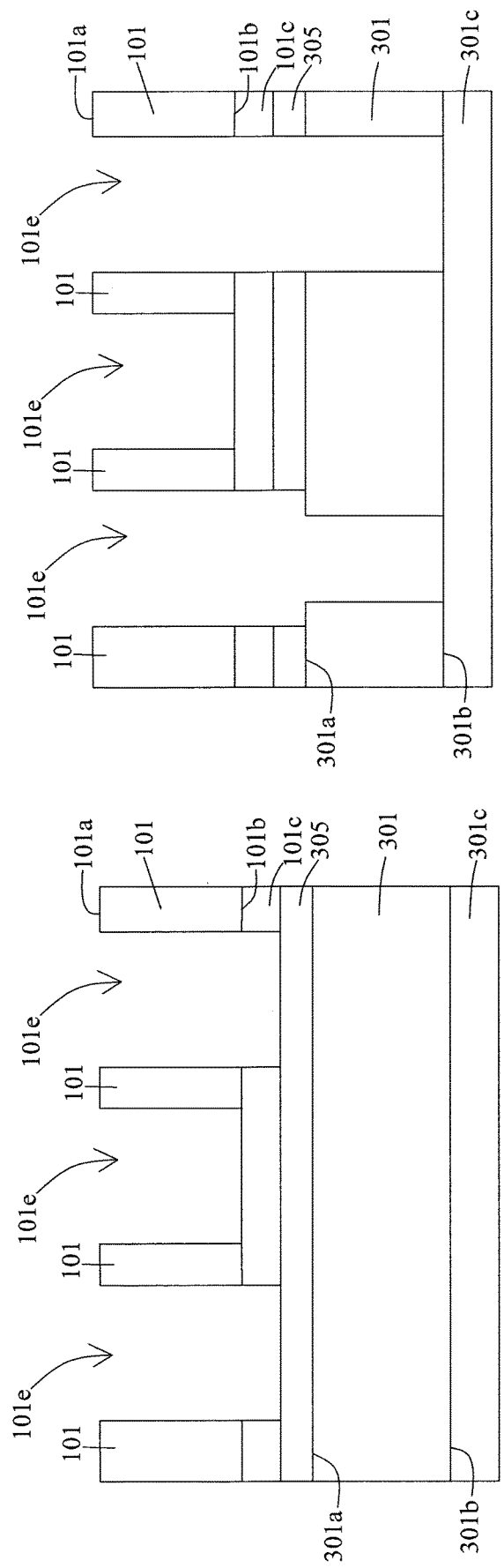

METHOD OF MANUFACTURING SEMICONDUCTOR STRUCTURE

CROSS-REFERENCE TO RELATED APPLICATIONS

This application is a divisional application of U.S. patent application Ser. No. 14/689,707 filed Apr. 17, 2015, entitled of ""SEMICONDUCTOR STRUCTURE AND MANUFACTURING METHOD THEREOF", which is incorporated herein by reference in its entirety.

BACKGROUND

Electronic equipment using semiconductor devices are essential for many modern applications. Three-dimensional (3D) stacked substrates are commonly involved in electronic equipment. The 3D stacked substrates include several stacked semiconductor die/chips/wafers that are physically and electrically interconnected with one another. Several die/chips/wafers are bonded and integrated through various interconnection structures. This allows higher component density in devices, such as mobile phones, digital cameras, etc.

Semiconductor image sensors are also commonly involved in electronic equipment. Complementary metal-oxide-semiconductor (CMOS) image sensors (CIS) are widely used in various applications, such as digital camera and mobile phone cameras. The CMOS image sensors are classified as front side illuminated (FSI) image sensors and back side illuminated (BSI) image sensors, depending on the light path difference. The BSI image sensors are gaining in popularity. The BSI image sensor includes an array of pixels. Each pixel includes a photo-diode, a transistor or a capacitor. Each pixel generates an electrical signal in response to incident light on the pixel. A magnitude of the electrical signal depends on the intensity of the incident light received by the respective pixels.

As technologies evolve, the semiconductor device is becoming increasingly smaller in size while having greater functionality and greater amounts of integrated circuitry. The manufacturing of the semiconductor device involves many complicated steps and operations. Since more different components with different materials are involved, complexity of the manufacturing and integration operations is increased. The increase in complexity of manufacturing may cause deficiencies such as delamination, cracking, high yield loss etc. The semiconductor device is produced in an undesired configuration, which would further exacerbate materials wastage and increase the manufacturing cost.

Therefore, there is a continuous need to modify structure and manufacturing method of the semiconductor device in order to improve the performance of the device as well as reduce cost and time on processing the device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6A is a schematic view of a substrate in accordance with some embodiments of the present disclosure.

FIG. 6B is a schematic view of a substrate with recesses in accordance with some embodiments of the present disclosure.

FIG. 6C is a schematic view of a semiconductor structure with a conductive vias in accordance with some embodiments of the present disclosure.

FIG. 6D is a graph illustrating a relationship between an electric current applied to a substrate and duration of time of electroplating operations in accordance with some embodiments of the present disclosure.

FIG. 7A is a schematic view of a substrate in accordance with some embodiments of the present disclosure.

FIG. 7B is a schematic view of a substrate with recesses in accordance with some embodiments of the present disclosure.

FIG. 7C is a schematic view of a substrate with barrier layers and seed layers in accordance with some embodiments of the present disclosure.

FIG. 7D is a schematic view of a semiconductor structure with conductive vias in accordance with some embodiments of the present disclosure.

FIG. 8C is a schematic view of a first substrate and a second substrate with recesses in accordance with some embodiments of the present disclosure.

FIG. 8D is a schematic view of a first substrate and a second substrate with recesses in accordance with some embodiments of the present disclosure.

DETAILED DESCRIPTION OF THE DISCLOSURE

Figure 1:
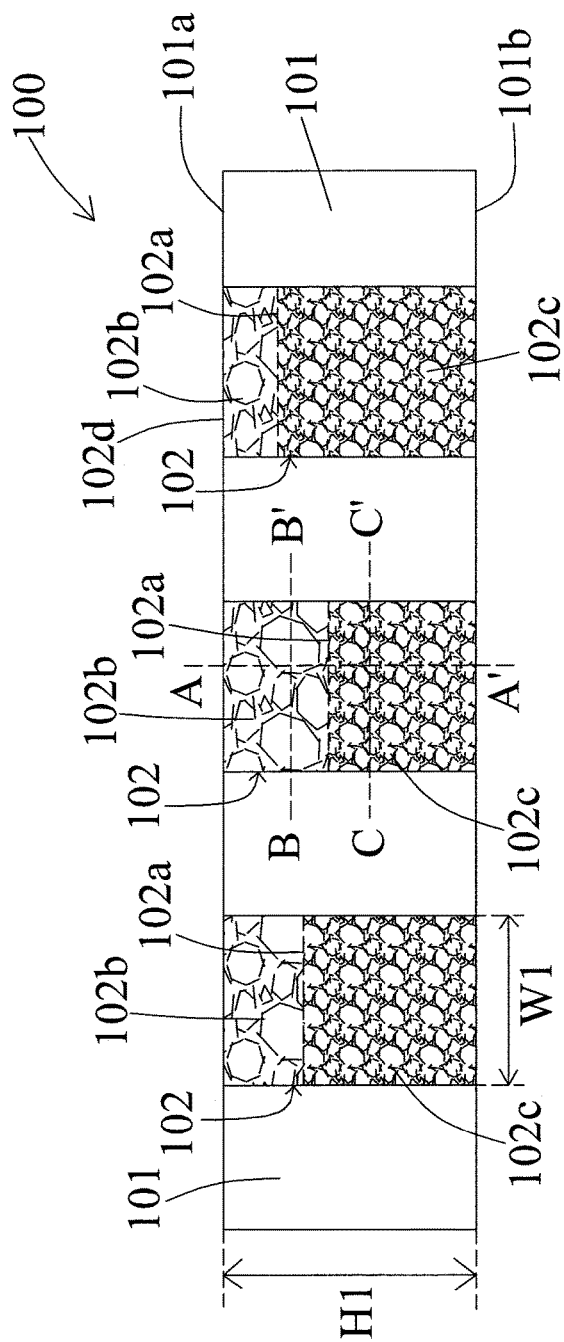
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor device, one or more pieces of substrates is involved. Each substrate may include several devices such as resistors, capacitors, diodes, etc. The devices are electrically connected by several interconnection structures. Some of interconnection structures pass through the substrate in order to electrically connect the devices in the substrate or electrically connect the devices with circuits external to the substrate. Some of interconnection structures pass through substrates stacking over each other in order to integrate circuits of substrates.

The interconnection structure is formed by depositing a conductive material such as copper in a via passing through the substrate. Prior to deposition of the conductive material, a seed layer is sputtered over the via of the substrate to assure good electrical contact and adhesion with subsequent layers of conductive material. The conductive material is deposited by electrochemical plating (electroplating) operations. The substrate is exposed to an electrolyte containing ions of the conductive material, and an electric current is applied to reduce the ions and thus deposit the conductive material over the seed layer. The electroplating operations include several stages. Different levels of electric current are applied in different stages in order to achieve different deposition rates and structure formation. The electric current is switched from one level to another when one stage is completed and next stage is commenced.

After deposition of the conductive material, other components or materials are subsequently disposed over the conductive material. However, the electroplated conductive material is not stable. A grain growth occurs in the conductive material, which is known as self-annealing. The electroplated conductive material undergoes self-annealing and exhibits changes in microstructure at a room temperature. A grain size of the electroplated conductive material is increased gradually. The growth of grains depend on a width of the via. The grain growth is not uniform and not under control.

Particularly, the conductive material adjacent to an opening of the via has faster grain growth than the conductive material within the via. As a result, some of the conductive material would be protruded from the via, and the protruded conductive material would force and break the components or materials subsequently disposed. Cracks would be developed and cause failure to the semiconductor device.

In the present disclosure, a semiconductor structure with improvement is disclosed. The semiconductor structure includes a substrate and a conductive via passing through the substrate. The conductive via is disposed in the recess by electroplating operations. During the electroplating operations, a low pulse current is applied and intervened between stages of electroplating. The application of the low pulse current during electroplating operations results in a formation of an interface in the conductive via. The interface is disposed between two portions with different average grain sizes. One of the portions of the conductive via has greater average grain size than another one.

In addition, the intervention of the low pulse current between stages of the electroplating operations constraints or controls the grain growth of the conductive via during self-annealing. Therefore, the conductive via would not force and break a block layer or other materials subsequently disposed over the conductive via. The conductive via has a smooth surface for receiving the block layer or other materials. Thus, formation of humps at or over the conductive via would be minimized or prevented. Adhesion and electrical connection between components would be enhanced, and therefore a reliability of the semiconductor device would also be improved.

FIG. 1 is a semiconductor structure 100 in accordance with various embodiments of the present disclosure. The semiconductor structure 100 includes a substrate 101 and a conductive via 102. In some embodiments, several conductive vias 102 are disposed in the substrate 101. For example, three conductive vias 102 are included in the semiconductor structure 100. However, it is not intended to limit a number of conductive vias 102 in the substrate 101. It is understood that one or more of conductive vias 102 can be disposed in the substrate 101.

In some embodiments, the substrate 101 includes a first side 101a and a second side 101b. The first side 101a is opposite to the second side 101b. In some embodiments, the substrate 101 includes some circuitries for electrical connection of components thereon. In some embodiments, the substrate 101 includes a number of layers for carrying components and circuits within the layers.

In some embodiments, the substrate 101 is a silicon substrate. In some embodiments, the substrate 101 includes silicon, germanium, gallium arsenide or other suitable semiconductive materials. In some embodiments, the substrate 101 is in a form of silicon-on-insulator (SOI), silicon-on-sapphire (SOS), doped and undoped semiconductors, epitaxial layers of silicon supported by a base semiconductor foundation, or other semiconductor structures.

In some embodiments, the conductive via 102 is disposed in the substrate 101. The conductive via 102 passes through the substrate 101. In some embodiments, the conductive via 102 is extended between the first side 101a and the second side 101b. In some embodiments, the conductive via 102 includes conductive material such as copper. In some embodiments, the conductive via 102 refers as through silicon via (TSV).

In some embodiments, the conductive via 102 extends in a substantially consistent width along a thickness of the substrate 101. In some embodiments, the conductive via 102 has an aspect ratio (W1:H1) substantially greater than about 1:3. In some embodiments, the aspect ratio (W1:H1) is about 1:2 to about 1:20. In some embodiments, the width W1 of the conductive via 102 adjacent to the first side 101a is substantially greater than about 0.3 μm. In some embodiments, the width W1 of the conductive via 102 is substantially greater than about 0.5 μm.

In some embodiments, the conductive via 102 includes a first portion 102b and a second portion 102c. In some embodiments, the first portion 102b is adjacent to the first side 101a of the substrate 101, and the second portion 102c is adjacent to the second side 101b of the substrate 101. In some embodiments, an interface 102a is disposed between the first portion 102b and the second portion 102c.

In some embodiments, the first portion 102b has an average grain size substantially different from an average grain size of the second portion 102c. In some embodiments, the average grain size of the first portion 102b is substantially greater than about 300 nm, and the average grain size of the second portion 102c is substantially less than about 300 nm.

As used herein, an "average grain size" of the conductive via 102 is measured by any conventional grain size measurement techniques such as X-ray diffraction (XRD), electron beam scattering pattern (EBSP), transmission electron microscopy (TEM), or scanning electron microscopy (SEM). A cross sectional plane of a sample of the conductive via 102 is prepared for any of the above measurements. In some embodiments, a cross section plane of the sample is obtained along a longitudinal direction of the conductive via 102. The longitudinal direction refers to a direction parallel to the greatest dimension of the conductive via 102. In some embodiments, a cross section plane of the sample is obtained along a horizontal direction of the conductive via 102. The horizontal direction refers to a direction perpendicular to the greatest dimension of the conductive via 102. In some embodiments, the cross sectional plane is subjected to any of the above measurements.

As used herein, an "electron beam scattering pattern (EBSP)" used for average grain size measurement is aided by a computer analysis program (for example, TSL OIM analysis). The setting of the computer analysis program includes, but not limited to, grain boundary mis-orientation of 15 degrees, confidence index (CI) value equal to or greater than 0.1, and minimal grain size of at least 5 testing points. In some embodiments, The average grain size of the EBSP measurement is obtained by averaging the grain sizes at least on three different testing locations of the cross sectional plane. A predetermined area is measured in each testing location. The predetermined area varies in accordance with features of different embodiments. Each testing location is at least 1 mm away from the adjacent testing location. In some embodiments, the interval between each measuring points in one testing location is at least 5 μm. In some embodiments, the prepared sample subjected to the EBSP measurement is observed under an accelerating voltage of 20 kV and a magnification of 100× to 500×. In some embodiments, the prepared sample is positioned at a tilting angle of 70 degrees.

As used herein, transmission electron microscopy (TEM), or scanning electron microscopy (SEM)" used for average grain size measurement is aided by an image analysis program (for example, CLEMEX Vision PE). In some embodiments, the average grain size of the TEM or SEM measurement is obtained by averaging the grain sizes at least on three different testing locations of the cross sectional plane. A predetermined area is measured in each testing location. The predetermined area varies in accordance with features of different embodiments. Each testing location is at least 1 mm away from the adjacent testing location. In some embodiments, the interval between each measuring points in one testing location is at least 5 μm. In some embodiments, the prepared sample subjected to the TEM or SEM measurement is observed under an accelerating voltage of 20 kV and a magnification of 100× to 500×.

In some embodiments, average grain sizes of the first portion 102b and the second portion 102c of the conductive via 102 are observed and measured respectively. Upon inspection of the conductive via 102 under an electron microscope, a grain structure of the conductive via 102 along a cross sectional plane AA', a grain structure of the first portion 102b along a cross sectional plane BB' and a grain structure of the second portion 102c along a cross sectional plane CC' are visualized and observed. In some embodiments, upon observation of the cross sectional plane along AA', the cross sectional plane along AA' demonstrates a clear grain size difference between the grains in the first portion 102b and the grains in the second portion 102c.

In some embodiments, an average grain size of the first portion 102b is measured by one grain of the first portion 102b in the cross sectional plane AA', and an average grain size of the second portion 102c is measured by one grain of the second portion 102c in the cross sectional plane AA'. In some embodiments, the average grain size of the first portion 102b is substantially different from the average grain size of the second portion 102c. In some embodiments, the average grain size of the first portion 102b is substantially greater than about 300 nm, and the average grain size of the second portion 102c is substantially less than about 300 nm.

Figure 2A:
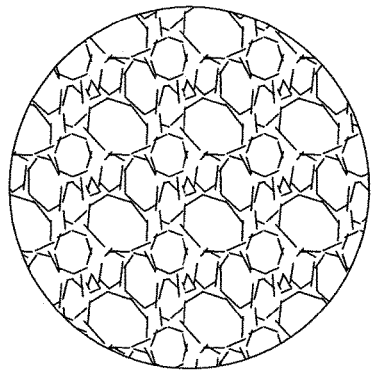
FIG. 2A is a schematic view of grains of a first portion of a conductive via throughout an area of a cross sectional plane BB' in FIG. 1.
Figure 2B:
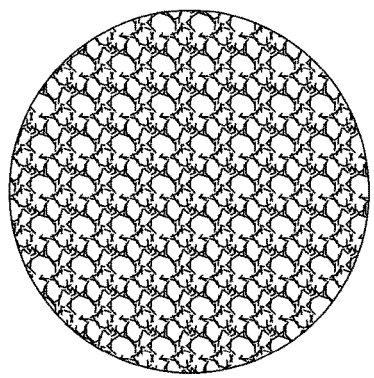
FIG. 2B is a schematic view of grains of a second portion of a conductive via throughout an area of a cross sectional plane CC' in FIG. 1.

FIG. 2A shows the first portion 102b of the conductive via 102 possessing a homogenous polycrystalline substantially throughout an area of the cross sectional plane BB'. In some embodiments, the grain size of the first portion 102b is uniformly distributed with a standard deviation less than 0.45. FIG. 2B shows the second portion 102c of the conductive via 102 possessing a homogenous polycrystalline substantially throughout an area of the cross sectional plan CC'. In some embodiments, the average grain size of the first portion 102*b* in the cross sectional plan BB' is close to, but not substantially the same as the average grain size of the first portion 102*b* in the cross sectional plan AA'. In some embodiments, the average grain size of the second portion 102*c* in the cross sectional plan CC' is close to, but not substantially the same as the average grain size of the second portion 102*c* in the cross sectional plan AA'.

Referring to FIG. 1, as the conductive via 102 includes two portions (102*b* and 102*c*) in different average grain sizes, the conductive via 102 includes a substantially flat surface 102*d* adjacent to the first side 101*a*. In some embodiments, the flat surface 102*d* is substantially parallel to the first side 101*a*, thereby other material or component subsequently disposed over the conductive via 102 is free from hump or hillock.

Figure 3A:
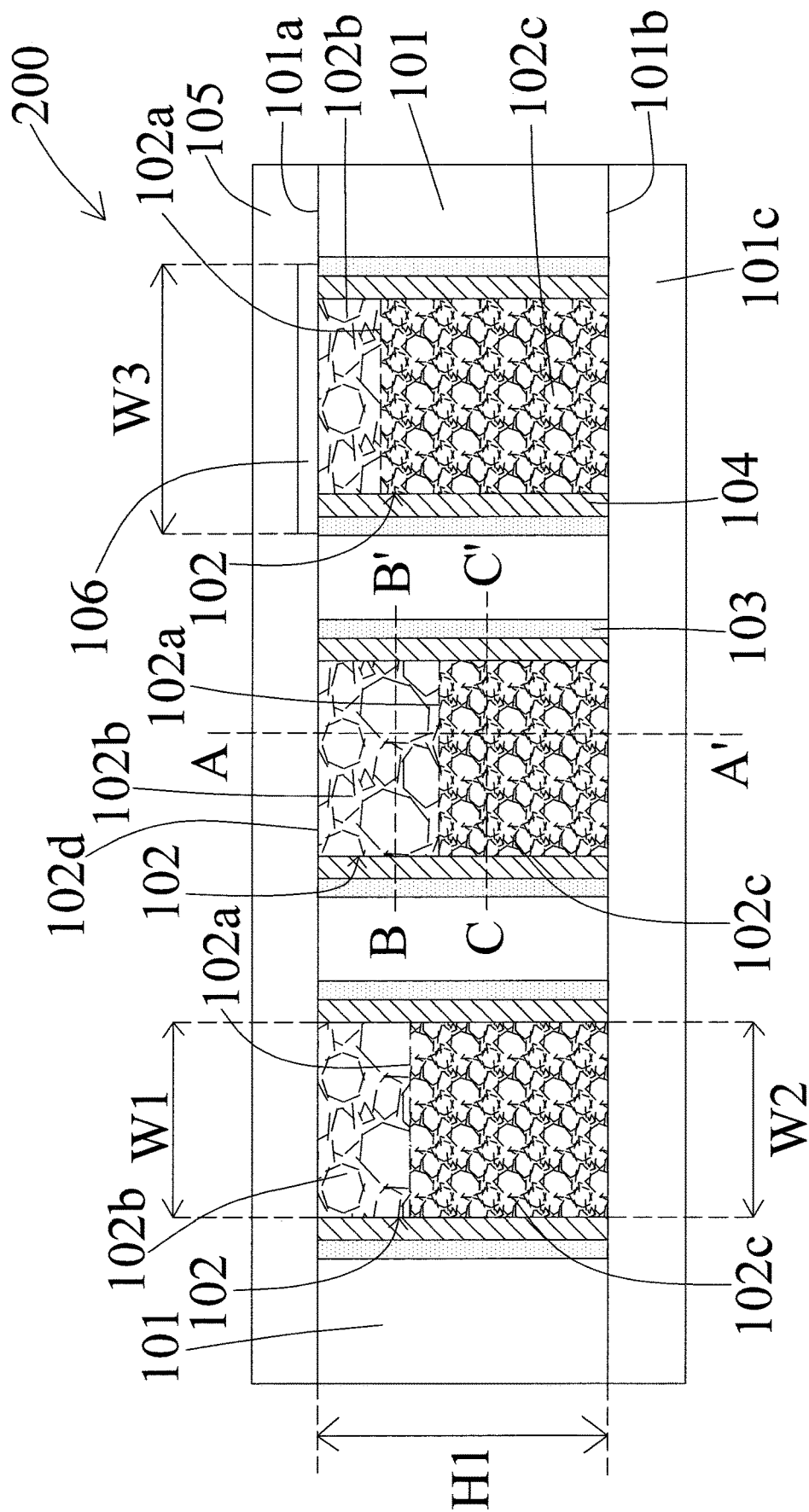
FIG. 3A is a schematic view of a semiconductor structure in accordance with some embodiments of the present disclosure.

FIG. 3A is a semiconductor structure 200 in accordance with various embodiments of the present disclosure. The semiconductor structure 200 includes a substrate 101 and a conductive via 102. In some embodiments, several conductive vias 102 are disposed in the substrate 101. For example, three conductive vias 102 are included in the semiconductor structure 100. However, it is not intended to limit a number of conductive vias 102 in the substrate 101. It is understood that one or more of conductive vias 102 can be disposed in the substrate 101. In some embodiments, the substrate 101 and the conductive via 102 have similar configuration as in FIG. 1.

In some embodiments, the substrate 101 includes a first side 101*a* and a second side 101*b* opposite to the first side 101*a*. In some embodiments, the substrate 101 includes a device layer 101*c* disposed over the second side 101*b* of the substrate 101. In some embodiments, the device layer 101*c* includes active or passive devices such as resistors, capacitors, or etc. surrounded by a dielectric material. In some embodiments, some of devices of the device layer 101*c* are electrically connected with the conductive via 102. In some embodiments, the conductive via 102 is extended from the first side 101*a* to second side 101*b* through the device layer 101*c*, so as to electrically connect the conductive via 102 with some of devices in the device 101*c*.

In some embodiments, the conductive via 102 is extended through the substrate 101. In some embodiments, the conductive via 102 includes copper. In some embodiments, the conductive via 102 includes a first portion 102*b* and a second portion 102*c*. The first portion 102*b* is adjacent to the first side 101*a*. The second portion 102*c* is adjacent to the device layer 101*c* of the substrate 101.

In some embodiments, the conductive via 102 has an aspect ratio (W1:H1) which is an ratio of a width to a height of the conductive via 102. In some embodiments, the aspect ratio (W1:H1) of the conductive via 102 is substantially greater than about 1:3. In some embodiments, the aspect ratio (W1:H1) of the conductive via 102 is about 1:2 to about 1:20. In some embodiments, the first portion 102*b* of the conductive via 102 has a width W1 substantially greater than about 0.3 µm. In some embodiments, the width W1 of the first portion 102*b* of the conductive via 102 is substantially greater than about 0.5 µm. In some embodiments, the width W1 of the conductive via 102 is substantially same as a width W2 of the second portion of the conductive via 102. In some embodiments, the width W1 is substantially greater than the width W2.

In some embodiments, the conductive via 102 includes an interface 102*a* between the first portion 102*b* and the second portion 102*c*. The interface 102*a* illustrates that an average grain size of the first portion 102*b* is substantially different from an average grain size of the second portion 102*c*. In some embodiments, the interface 102*a* can be observed along a cross sectional plane AA' by electron microscope as described above.

In some embodiments, the average grain size of the first portion 102*b* and the second portion 102*c* can be observed and measured along cross sectional planes (BB' and CC') by SEM or other suitable equipments as explained above. In some embodiments, the average grain size of the first portion 102*b* is substantially greater than the average grain size of the second portion 102*c*. In some embodiments, the average grain size of the first portion 102*b* is substantially greater than about 300 nm, and the average grain size of the second portion 102*c* is substantially less than about 300 nm.

In some embodiments, a barrier layer 103 or a seed layer 104 is disposed between the conductive via 102 and the substrate 101. In some embodiments, the barrier layer 103 is used a thin layer deposited between the substrate 101 and the seed layer 104. The barrier layer 103 promotes the adhesion strength between the substrate 101 and the conductive via 102 formed on the seed layer 104. In some embodiments, the barrier layer is TaN, Ta, TaSiN, TiN, or the combination thereof. In some embodiments, the seed layer 104 is a thin layer deposited prior to a formation of the conductive via 102. In some embodiments, the seed layer 104 includes copper.

In some embodiments, the semiconductor structure 200 includes a dielectric layer 105 disposed over the substrate 101. In some embodiments, several conductive structures are disposed within the dielectric layer 105. In some embodiments, the conductive via 102 is extended through the dielectric layer 105 and the substrate 101 in order to electrically connect with the conductive structures in the dielectric layer 105 or components external to the semiconductor structure 200.

In some embodiments, a conductive pad 106 is disposed over the first portion 102*b* of the conductive via 102. In some embodiments, the conductive pad 106 is electrically connected with the conductive via 102. In some embodiments, the conductive pad 106 is configured to receive a conductive structure or other components external to the semiconductor structure 200. In some embodiments, the conductive pad 106 has a width W3 substantially greater than about 3 µm. In some embodiments, the width W3 of the conductive pad 106 is about 2 µm to about 6 µm.

Figure 3B:
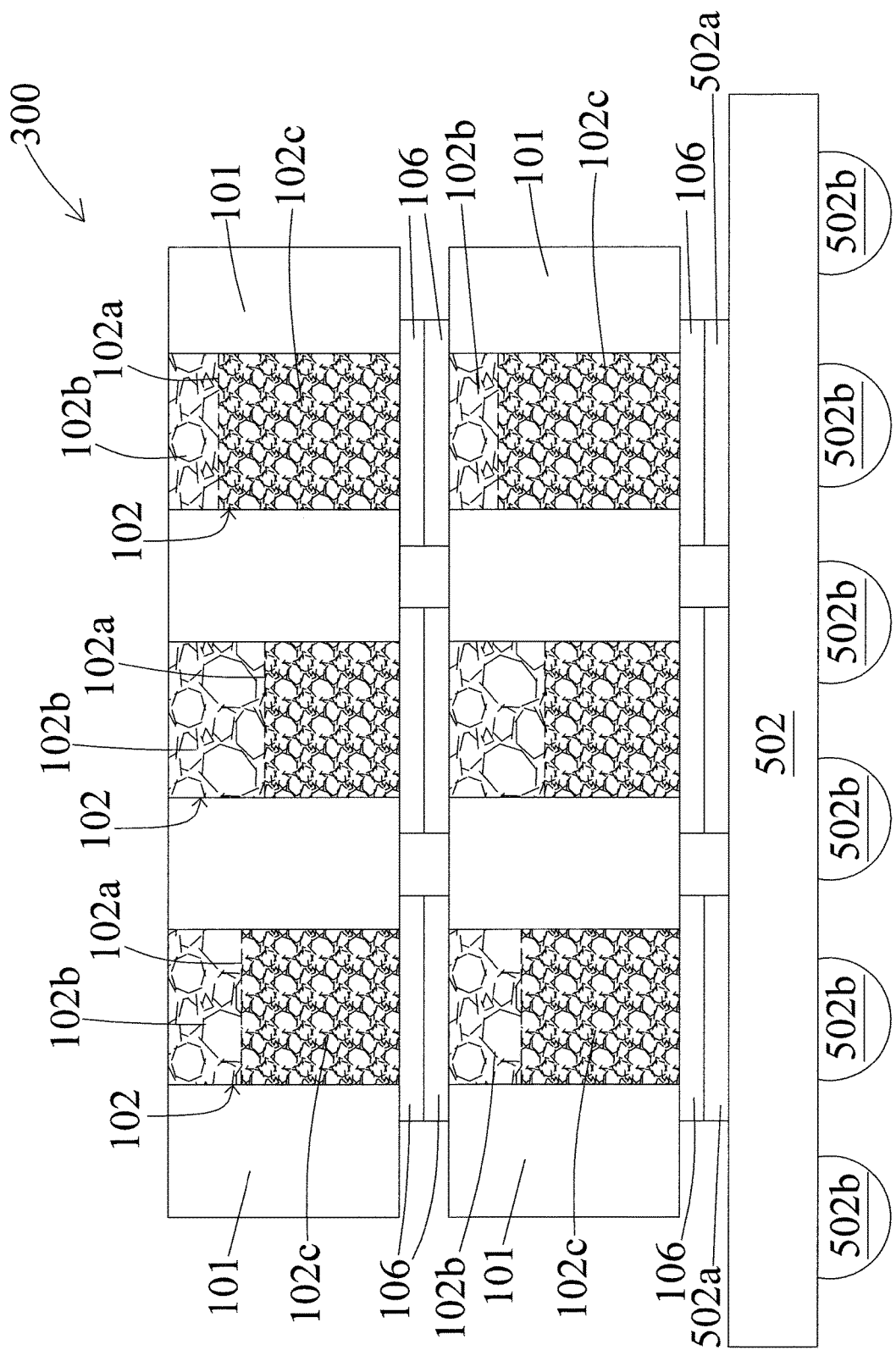
FIG. 3B is a schematic view of a semiconductor structure in accordance with some embodiments of the present disclosure.

FIG. 3B is a semiconductor structure 300 in accordance with various embodiments of the present disclosure. In some embodiments, the semiconductor structure 300 includes several substrates 101 stacking over each other. In some embodiments, the stacked substrates 101 refer as stacked dies or stacked chips. In some embodiments, each substrate 101 has similar configuration as in FIG. 1. In some embodiments, each substrate 101 includes several conductive vias 102 which are in similar configuration as in FIG. 1. In some embodiments, the conductive via 102 refers as TSV passing through the substrate 101. Each conductive via 102 includes an interface 102*a*, a first portion 102*b* and a second portion 102*c*. In some embodiments, the conductive vias 102 of the substrates 101 are bonded and electrically connected by several conductive pads 106. As such, circuitries of the substrates 101 are integrated by the conductive vias 102 and the conductive pads 106.

In some embodiments, the semiconductor structure 300 includes an interposer or package substrate 502. The package substrate 502 includes several bond pads 502*a* and several conductive bumps 502b. In some embodiments, the bond pads 502a are bonded and electrically connected with the conductive pads 106 of the substrate 101 adjacent to the interposer 502. As such, a circuitry of the interposer 502 is integrated with the circuitries of the substrates 101 by the conductive vias 102, the conductive pads 106 and the bond pads 502a. The circuitry of the interposer 502 and the circuitries of the substrates 101 can be integrated with an external circuitry through the conductive bumps 502b. In some embodiments, the semiconductor structure 300 is a three-dimensional (3D) integrated circuit or 3D package.

Figure 4:
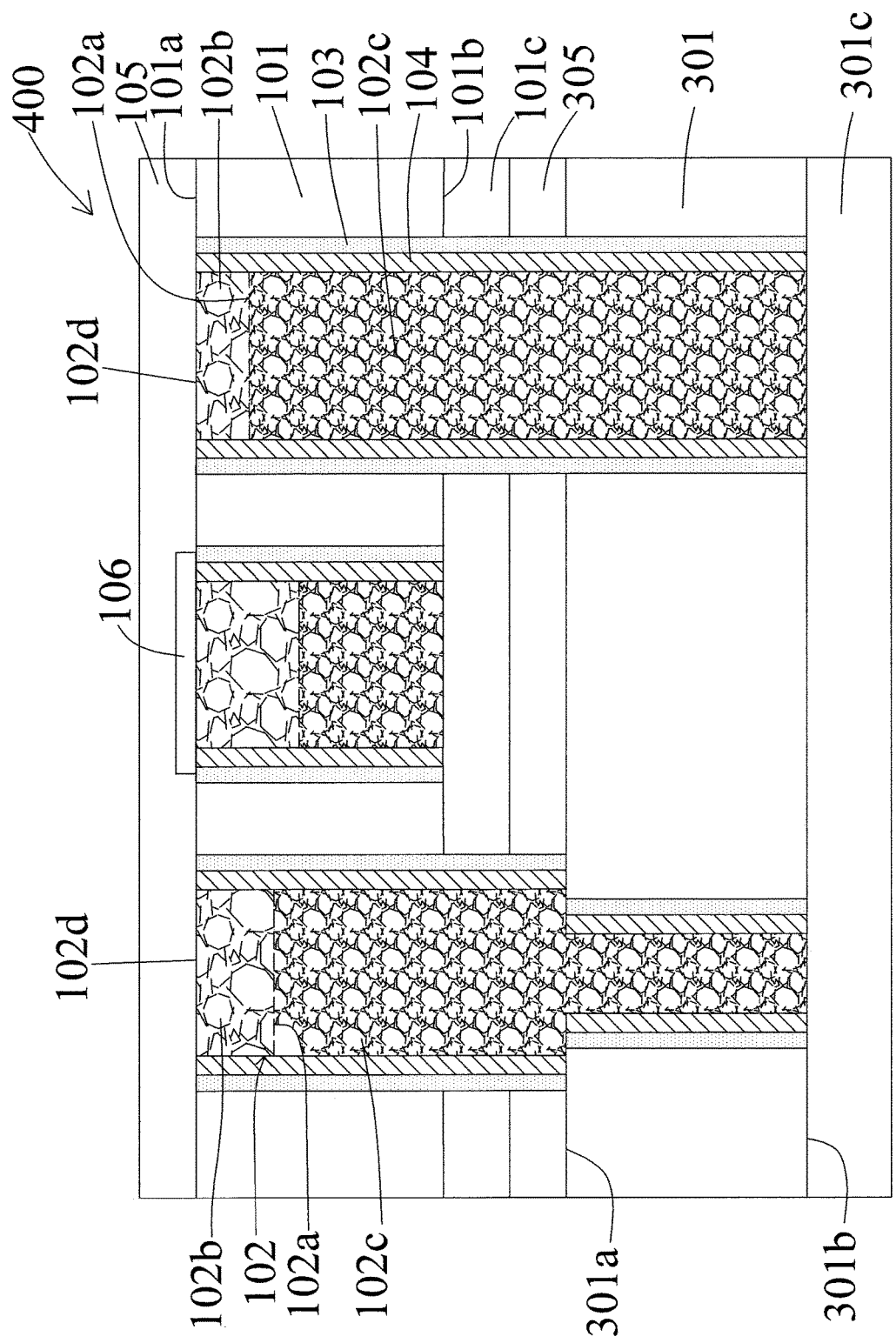
FIG. 4 is a schematic view of a semiconductor structure in accordance with some embodiments of the present disclosure.

FIG. 4 is a semiconductor structure 400 in accordance with various embodiments of the present disclosure. In some embodiments, the semiconductor structure 400 is a three-dimensional (3D) integrated circuit or 3D package. In some embodiments, the semiconductor structure 400 includes a first substrate 101, a second substrate 301 and a conductive via 102. In some embodiments, the first substrate 101 and the second substrate 301 have similar configuration as the substrate 101 in FIG. 1, 3A or 3B.

In some embodiments, the second substrate 301 is bonded over the first side 101a or the second side 101b of the first substrate 101. In some embodiments, the first substrate 101 and the second substrate 301 are stacked over each other. In some embodiments, the second side 101b of the first substrate 101 is bonded with a first side 301a of the second substrate 301. In some embodiments, the first side 101a of the first substrate 101 is bonded with a second side 301b of the second substrate 301. In some embodiments, a device layer 301c of the second substrate 301 is bonded with the first substrate 101. In some embodiments, a dielectric layer 305 over the second substrate 301 is bonded with the first substrate 101.

In some embodiments, several conductive vias 102 are disposed in the first substrate 101 and the second substrate 301. A portion of the conductive via 102 is coupled with the second substrate 301. In some embodiments, the conductive via 102 passes through the first substrate 101 and the second substrate 301, such that the first substrate 101 is integrated with the second substrate 301. In some embodiments, a circuitry in the first substrate 101 is electrically connected with a circuitry in the second substrate 301 through the conductive via 102. In some embodiments, the conductive via 102 refers as TSV passing through more than one piece of substrates (101 and 301).

In some embodiments, the conductive via 102 includes a first portion 102b, a second portion 102c and an interface 102a disposed between the first portion 102b and the second portion 102c. In some embodiments, the first portion 102b has different average grain size from the second portion 102c. Measurement of the average grain size can refer to the method explained above. In some embodiments, the average grain size of the first portion 102b is substantially greater than the average grain size of the second portion 102c. In some embodiments, the average grain size of the first portion 102b is substantially greater than about 300 nm. In some embodiments, the average grain size of the second portion 102c is substantially less than about 300 nm.

Figure 5:
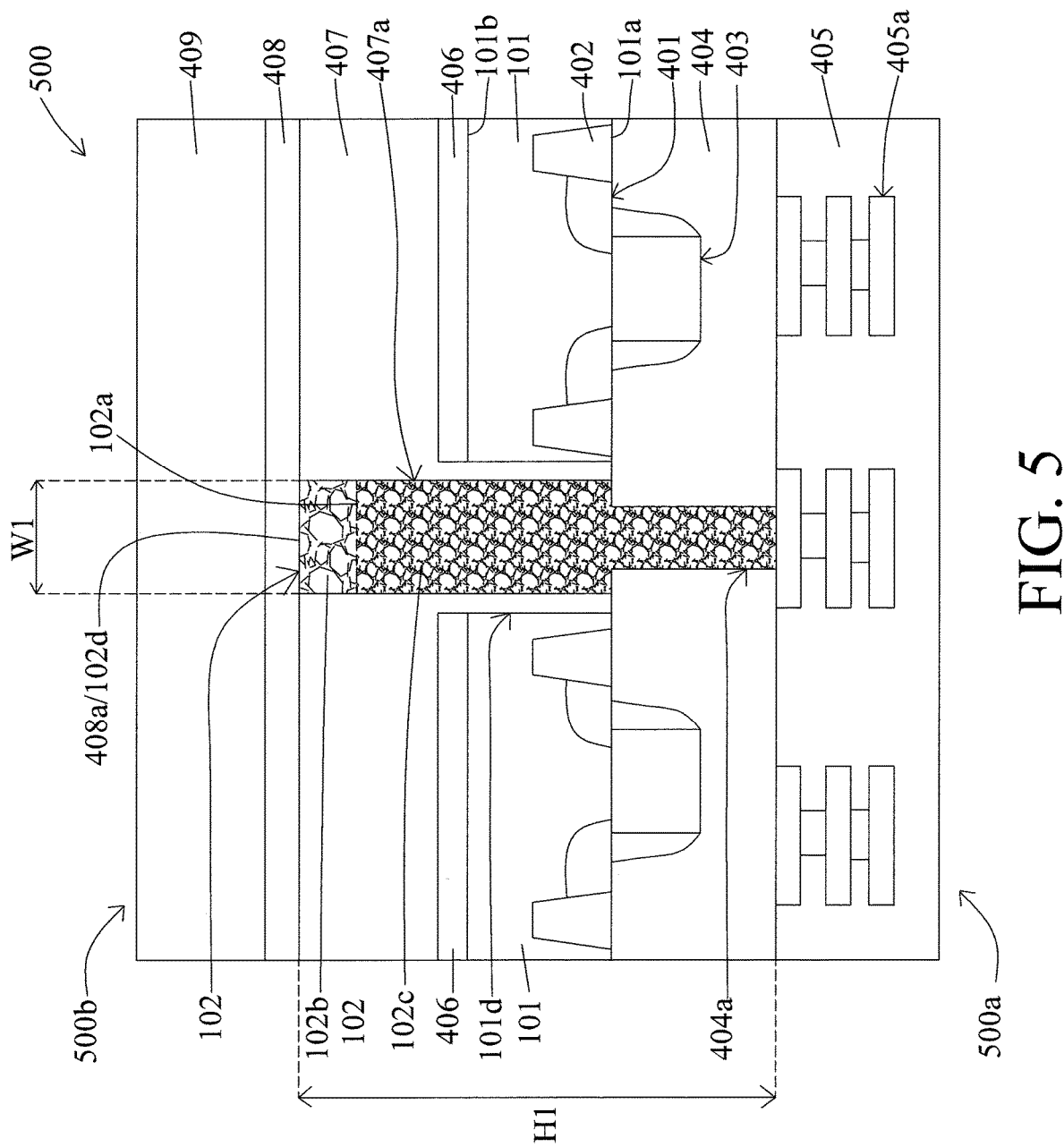
FIG. 5 is a schematic view of a semiconductor structure in accordance with some embodiments of the present disclosure.

FIG. 5 is a semiconductor structure 500 in accordance with various embodiments of the present disclosure. In some embodiments, the semiconductor structure 500 is configured to sense an electromagnetic radiation of an image incident on the semiconductor structure 500. In some embodiments, the semiconductor structure 500 is an image sensor. In some embodiments, the semiconductor structure 500 is a complementary metal-oxide-semiconductor (CMOS) image sensor. In some embodiments, the semiconductor structure 500 is a back side illuminated CMOS image sensor. The electromagnetic radiation of the image is incident on a back side 500b of the semiconductor structure 500.

In some embodiments, the semiconductor structure 500 includes a substrate 101. In some embodiments, the substrate 101 includes silicon. In some embodiments, the substrate 101 is a CMOS sensor substrate. In some embodiments, the substrate 101 has similar configuration as in FIG. 1. In some embodiments, the substrate 101 includes a first side 101a and a second side 101b opposite to the first side 101a. In some embodiments, the first side 101a refers as a front side, and the second side 101b refers as a back side.

In some embodiments, the substrate 101 includes a first recess 101d extending between the first side 101a and the second side 101b of the substrate 101. In some embodiments, the first recess 101d is configured to receive a conductive material or a dielectric material.

In some embodiments, the substrate 101 includes a photodiode 401. The photodiode 401 is disposed in the substrate 101. In some embodiments, the photodiode 401 is configured to detect the electromagnetic radiation incident on the second side 101b of the substrate 101. The photodiode 401 is configured to generate an electrical signal in accordance with intensity or brightness of the electromagnetic radiation impinging on the photodiode 401. In some embodiments, the photodiode 401 is implemented as a pinned layer photodiode including n-type doped region formed in the substrate 101 and heavily doped p-type region formed on a surface of the n-type doped region to form a p-n-p junction.

In some embodiments, the substrate 101 includes an isolating member 402. In some embodiments, the isolating member 402 is a shallow trench isolation (STI). In some embodiments, the isolating member 402 includes an oxide or dielectric for separating and electrically isolating the photodiode 401. In some embodiments, the isolating member 402 is arranged in a grid manner. In some embodiments, the isolating member 402 includes silicon oxide, silicon nitride, silicon oxynitride, a low-k material or etc. In some embodiments, the isolating member 402 has a depth extended from the first side 101a towards the second side 101b of the substrate 101.

In some embodiments, a metal gate 403 is disposed over the substrate 101. In some embodiments, the metal gate 403 is disposed at the first side 101a of the substrate 101. In some embodiments, the metal gate 403 includes polysilicon, doped polysilicon, metal gate material, etc. In some embodiments, the metal gate 403 is a transfer transistor. In some embodiments, an interlayer dielectric (ILD) 404 is disposed over the first side 101a of the substrate 101. In some embodiments, the ILD 404 includes boron phosphorous silicate glass (BPSG) or any other dielectric materials. In some embodiments, the ILD 404 includes a second recess 404a passing through the ILD 404. In some embodiments, the second recess 404a is configured to receive a conductive material.

In some embodiments, an intermetallic dielectric (IMD) 405 is disposed over the ILD 404 or the first side 101a of the substrate 101. In some embodiments, the IMD 405 includes a metallic structure 405a surrounded by a dielectric layer. In some embodiments, the metallic structure 405a is electrically communicable with the substrate 101 or other conductive components in the semiconductor structure 500. In some embodiments, the second recess 404 is disposed over the metallic structure 405a of the IMD. In some embodiments, the metallic structure 405a is electrically connected with the conductive material disposed within the second recess 404a.

In some embodiments, a high dielectric constant (high k) dielectric layer 406 is disposed over the second side 101b of the substrate 101. In some embodiments, the high k dielectric layer 406 includes Hafnium (IV) oxide (HfO$_2$), Tantalum pentoxide (Ta$_2$O$_5$) or etc.

In some embodiments, a dielectric layer 407 is disposed over the second side 101b of the substrate 101 or the high k dielectric layer 406. In some embodiments, the dielectric layer 407 includes oxide such as silicon dioxide. In some embodiments, the dielectric layer 407 includes a third recess 407a disposed within the first recess 101d of the substrate 101. Thus, some of the dielectric layer 407 is disposed within the first recess 101d of the substrate 101.

In some embodiments, a conductive via 102 is disposed within the substrate 101 and the dielectric layer 407. The conductive via 102 passes through the substrate 101 and the dielectric layer 407. In some embodiments, the conductive 102 also passes through the ILD 404. n some embodiments, the conductive via 102 is disposed within the first recess 101d of the substrate 101, the second recess 404a of the ILD 404 and the third recess 407a of the dielectric layer 407. In some embodiments, the dielectric layer 407 is disposed between the conductive via 102 and the substrate 101. In some embodiments, the conductive via 102 is electrically connected to the substrate 101, the ILD 404 or the IMD 405. In some embodiments, the conductive via 102 includes conductive material such as copper.

In some embodiments, the conductive via 102 refers as a through oxide via (TOV). In some embodiments, the conductive via 102 is in a staggered or stepped configuration. The conductive via 102 includes at least one step along a thickness of the semiconductor structure 500. In some embodiments, the conductive 102 is extended in a consistent width along the thickness of the semiconductor structure 500. In some embodiments, the conductive via 102 has an aspect ratio (W1:H1) substantially greater than about 1:3. In some embodiments, the aspect ratio (W1:H1) is about 1:2 to about 1:20. In some embodiments, the width W1 of the conductive via 102 adjacent to the back side 500b of the semiconductor structure 500 is substantially greater than about 0.3 µm. In some embodiments, the width W1 of the conductive via 102 is substantially greater than about 0.5 µm.

In some embodiments, a block layer 408 is disposed over the conductive via 102 and the second side 102b of the substrate 101. In some embodiments, the block layer 480 is disposed over the dielectric layer 407. In some embodiments, the block layer 408 is configured to block a predetermined electromagnetic radiation. In some embodiments, the block layer 480 includes nitride such as silicon nitride.

In some embodiments, the conductive via 102 includes a first portion 102b adjacent to the block layer 408, a second portion 102c adjacent to the first side 101a of the substrate 101, and an interface 102a between the first portion 102b and the second portion 102c. In some embodiments, the first portion 102b is disposed within the substrate 101 or the dielectric layer 407. In some embodiments, the second portion 102c is disposed within the substrate 101, the dielectric layer 407 or the ILD 404. In some embodiments, the interface 102a is disposed within the substrate 101 or the dielectric layer 407.

In some embodiments, the first portion 102b has an average grain size substantially different from an average grain size of the second portion 102c. Measurement of an average grain size can refer to a method explained above. In some embodiments, the average grain size of the first portion 102b is substantially greater than the average grain size of the second portion 102c. In some embodiments, the average grain size of the first portion 102b is substantially greater than about 300 nm, and the average grain size of the second portion 102c is substantially less than about 300 nm.

Since a grain growth of the first portion 102b of the conductive via 102 is constrained, the conductive via 102 would not be excessive or protruded from the third recess 407a. Thus, the block layer 408 can be smoothly disposed over the conductive via 102 and the dielectric layer 407. As such, formation of humps or hillocks at the block layer 408 interfacing the conductive via 102 would be minimized or prevented.

In some embodiments, the block layer 408 is extended substantially parallel to the second side 101b of the substrate 101. In some embodiments, a second interface 408a between the block layer 408 and the conductive via 102 is substantially parallel to the second side 101b of the substrate 101. As the first portion 102b of the conductive via 102 has a substantially flat surface 102d, the block layer 408 can be smoothly disposed over the conductive via 102. In some embodiments, the second interface 408a between the block layer 408 and the conductive via 102 is substantially greater than about 0.3 um.

In some embodiments, components 409 are disposed over the block layer 408. In some embodiments, the components 409 include metal grid, anti-reflective coating, color filters, microlens, etc. In some embodiments, the metal grid is configured to isolate the color filters or other conductive components. In some embodiments, the anti-reflective coating is configured to reduce reflection when the electromagnetic radiation is incident on the back side 500b of the semiconductor structure 500. In some embodiments, the color filter is configured to allow the electromagnetic radiation in a particular range of wavelength passing through. In some embodiments, the microlens is configured to focus the electromagnetic radiation incident on the back side 500b towards the color filters.

Figure 6:
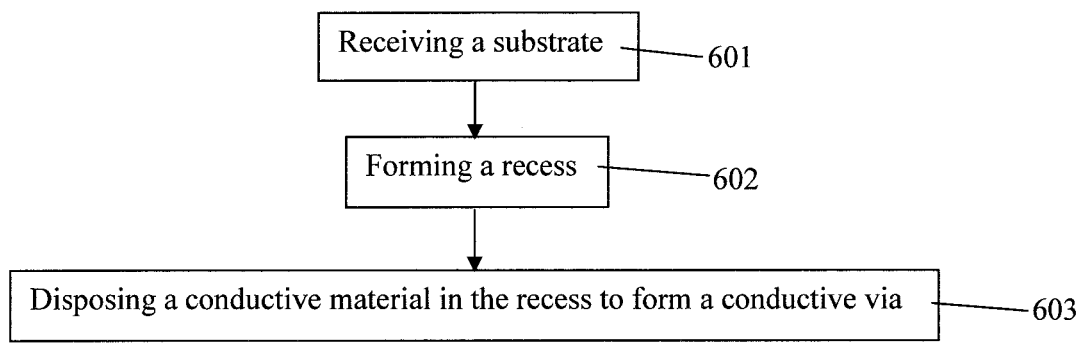
FIG. 6 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 600. The method 600 includes a number of operations and the description and illustration are not deemed as a limitation as the sequence of the operations. FIG. 6 is an embodiment of a method 600 of manufacturing a semiconductor structure. The method 600 includes a number of operations (601, 602 and 603).

In operation 601, a substrate 101 is received or provided as shown in FIG. 6A. In some embodiments, the substrate 101 is a silicon substrate. In some embodiments, the substrate 101 has similar configuration as the substrate 101 in the semiconductor structure 100 of FIG. 1. In some embodiments, the substrate 101 includes a first side 101a and a second side 101b opposite to the first side 101a.

In operation 602, a recess 101e is formed as shown in FIG. 6B. In some embodiments, the recess 101e is formed within the substrate 101 and is extended between the first side 101a and the second side 101b of the substrate 101. In some embodiments, the recess 101e is formed by photolithography, etching, laser drilling or any other suitable operations. In some embodiments, the recess 101e has an aspect ratio (W1:H1) substantially greater than about 1:3. In some embodiments, a width of the recess 101e is substantially greater than about 0.3 µm. In some embodiments, a barrier layer or a seed layer is disposed conformal to the recess 101e.

In operation 603, a conductive material is disposed in the recess 101e to form a conductive via 102 as shown in FIG.

6C. In some embodiments, the conductive material such as copper is disposed in the recess 101e by electroplating operations. During the electroplating operations, different levels of electric currents (Y1, Y2, Y3, Y4) are applied to the substrate 101 at different stages (0 to X1, X1 to X2, X2 to X3, X3 to X4) of the electroplating as shown in FIG. 6D. In some embodiments, the electroplating operations includes more than one stages. In some embodiments, the electric currents (Y1, Y2, Y3, Y4) are direct electric (DC) current.

In some embodiments, an initial current Y1 is applied at an initial stage (from 0s to X1 s). In some embodiments, the initial current Y1 is about 1 Ampere (A). In some embodiments, a first current Y2 is applied at a first stage (from X1 to X2) after the initial stage (from 0s to X1 s). In some embodiments, the first current Y2 is about 5 A to about 10 A. In some embodiments, a pulse current Y3 is applied at a pulse stage (from X2 to X3) after the first stage. In some embodiments, the pulse current Y3 is substantially smaller than the first current Y2. In some embodiments, a duration (from X2 to X3) of the pulse current Y3 is substantially less than a duration (from X1 to X2) of the first current Y2 or a duration (from 0 to X1) of the initial current Y1. In some embodiments, the pulse current Y3 is less than or equal to about 1 A. In some embodiments, a second current Y4 is applied at a second stage (X3 to X4) after the pulse stage. In some embodiments, the second current Y4 is about 30 A to about 50 A. In some embodiments, the second current Y4 is substantially greater than the initial current Y1, the first current Y2 and the pulse current Y3. In some embodiments, the pulse current Y3 intervenes between the first current Y2 and the second current Y4. In some embodiments, the pulse current Y3 intervenes between any two of the stages of the electroplating operations. In some embodiments, the pulse current Y3 is substantially smaller than the first current Y2 and the second current Y4. In some embodiments, the first current Y2 is between the second current Y4 and the pulse current Y3. In some embodiments, a duration (from X2 to X3) of the pulse current Y3 is substantially less than a duration (from X1 to X2) of the first current Y2 and a duration (from X3 to X4) of the second current Y4.

Since the pulse current Y3 intervenes between any two of the stages of the electroplating operations, a grain growth of the conductive material is constrained during self-annealing. As such, the conductive via 102 including an interface 102a, a first portion 102b and a second portion 102c is formed as shown in FIG. 6C. In some embodiments, the interface 102a is disposed between the first portion 102b and the second portion 102c. In some embodiments, the first portion 102b is adjacent to the first side 101a of the substrate 101, and the second portion 102c is adjacent to the second side 101b of the substrate 101. In some embodiments, the first portion 102b has a substantially flat surface 102d. The flat surface 102d is substantially parallel to the first side 101a of the substrate 101, so that a component subsequently disposed can be smoothly disposed on the conductive via 102 and the substrate 101.

Average grain size of the conductive via 102 is measured according to the method explained above. In some embodiments, an average grain size of the first portion 102b is substantially different from an average grain size of the second portion 102c. In some embodiments, the average grain size of the first portion 102b is substantially greater than the average grain size of the second portion 102c. In some embodiments, the average grain size of the first portion 102b is substantially greater than about 300 nm, and the average grain size of the second portion 102c is substantially less than about 300 nm.

In some embodiments, the carrier substrate 501 is removed after the formation of the conductive via 102. In some embodiments, the semiconductor structure 100 as in FIG. 1 is formed by the operations 601-603.

Figure 7:
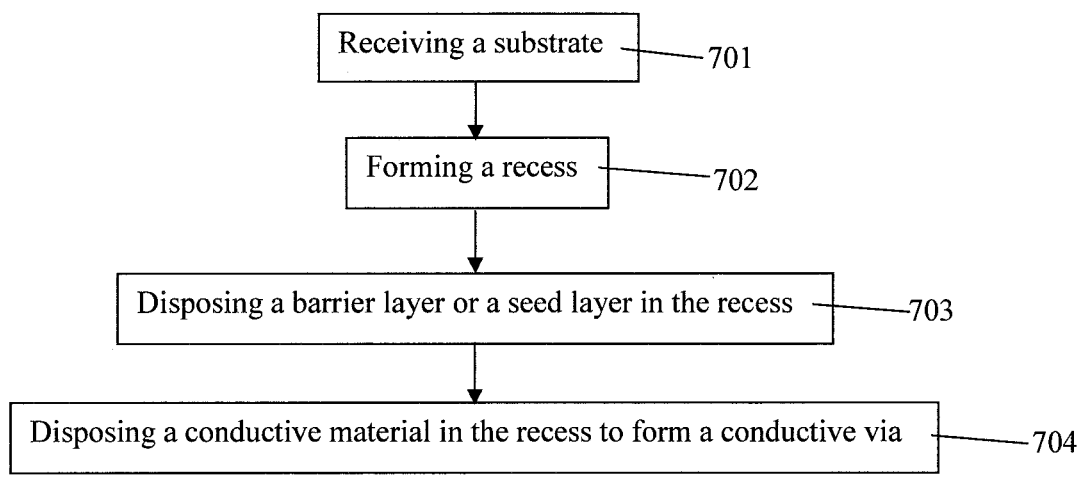
FIG. 7 is a flow diagram of a method of manufacturing a semiconductor structure in accordance with some embodiments of the present disclosure.

In some embodiments, a semiconductor structure is formed by a method 700. The method 700 includes a number of operations and the description and illustration are not deemed as a limitation as the sequence of the operations. FIG. 7 is an embodiment of a method 700 of manufacturing a semiconductor structure. The method 700 includes a number of operations (701, 702, 703 and 704).

In operation 701, a substrate 101 is received or provided as shown in FIG. 7A. In some embodiments, the substrate 101 includes a first side 101a, a second side 101b and a device layer 101c. In some embodiments, the device layer 101c includes active or passive devices such as resistors, capacitors, or etc. surrounded by a dielectric material. In some embodiments, the operation 701 is similar to the operation 601.

In operation 702, a recess 101e is formed as shown in FIG. 7B. In some embodiments, the recess 101e is extended between the first side 101a and the second side 101b of the substrate 101. In some embodiments, the operation 702 is similar to the operation 602.

In operation 703, a barrier layer 103 or a seed layer 104 is disposed in the recess 101e as shown in FIG. 7C. In some embodiments, the barrier layer 103 or the seed layer 104 is disposed conformal to the recess 101e. In some embodiments, the barrier layer 103 is disposed by any suitable operations such as electroplating, electroless plating, physical vapor deposition (PVD), chemical vapor deposition (CVD), or combination thereof. In some embodiments, the seed layer 104 is disposed by any suitable operations such as electroplating, electroless plating, PVD, CVD, or combination thereof.

In operation 704, a conductive material is disposed in the recess 101e to form a conductive via 102 as shown in FIG. 7D. In some embodiments, the operation 704 is similar to the operation 603. In some embodiments, the conductive material such as copper is disposed in the recess 101e or on the seed layer 104 by electroplating operations. During the electroplating operations, different levels of currents (Y1, Y2, Y3, Y4) are applied to the substrate 101 at different stages (0 to X1, X1 to X2, X2 to X3, X3 to X4) of the electroplating as in the operation 603. The pulse current Y3 intervenes between the first current Y2 and the second current Y4 as shown in FIG. 6D. After the electroplating operations, the conductive via 102 including an interface 102a, a first portion 102b and a second portion 102c is formed as shown in FIG. 7D.

In some embodiments, an average grain size of the first portion 102b is substantially different from an average grain size of the second portion 102c. In some embodiments, the average grain size of the first portion 102b is substantially greater than the average grain size of the second portion 102c. In some embodiments, the average grain size of the first portion 102b is substantially greater than about 300 nm, and the average grain size of the second portion 102c is substantially less than about 300 nm.

In some embodiments, a conductive pad 106 is disposed over the first portion 102b of the conductive via 102 by electroplating or any other suitable operations. In some embodiments, the first portion 102b has a substantially flat surface 102d. The flat surface 102d is substantially parallel to the first side 101a of the substrate 101. In some embodiments, a dielectric layer 105 is disposed over the conductive via 102 and the first side 101 of the substrate 101. The dielectric layer 105 can be smoothly disposed on the conductive via 102 and the substrate 101. In some embodiments, the semiconductor structure 200 as in FIG. 3A is formed by the operations 701-704.

Figure 8:
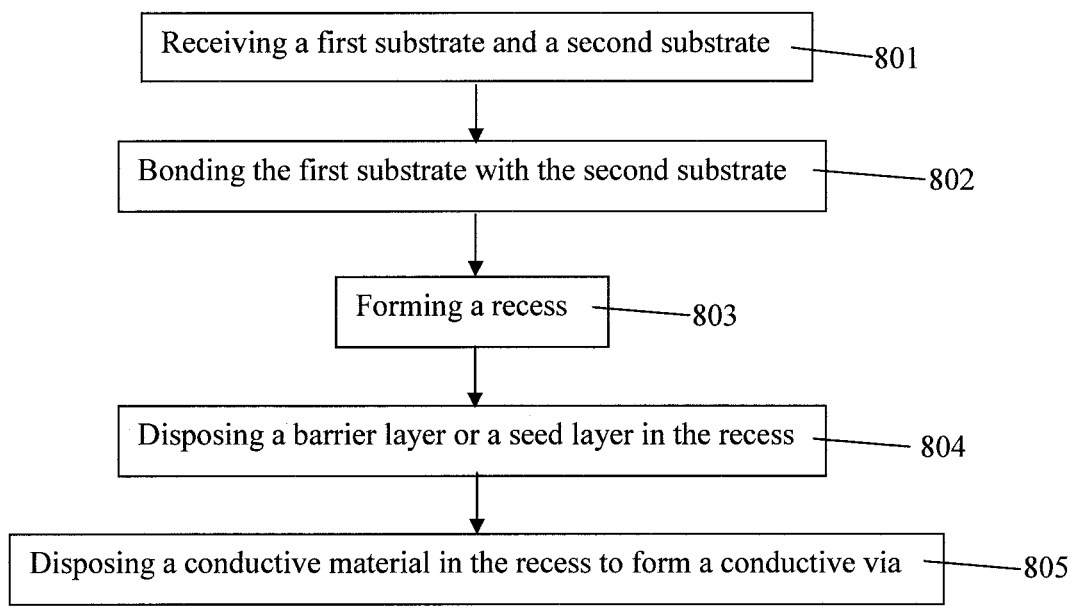
FIG. 8 is a flow diagram of a method of manufacturing a semiconductor structure in accordance with some embodiments of the present disclosure.

In some embodiments, a semiconductor structure is formed by a method 800. The method 800 includes a number of operations and the description and illustration are not deemed as a limitation as the sequence of the operations. FIG. 8 is an embodiment of a method 800 of manufacturing a semiconductor structure. The method 800 includes a number of operations (801, 802, 803, 804 and 805).

Figures 8A, 8B:
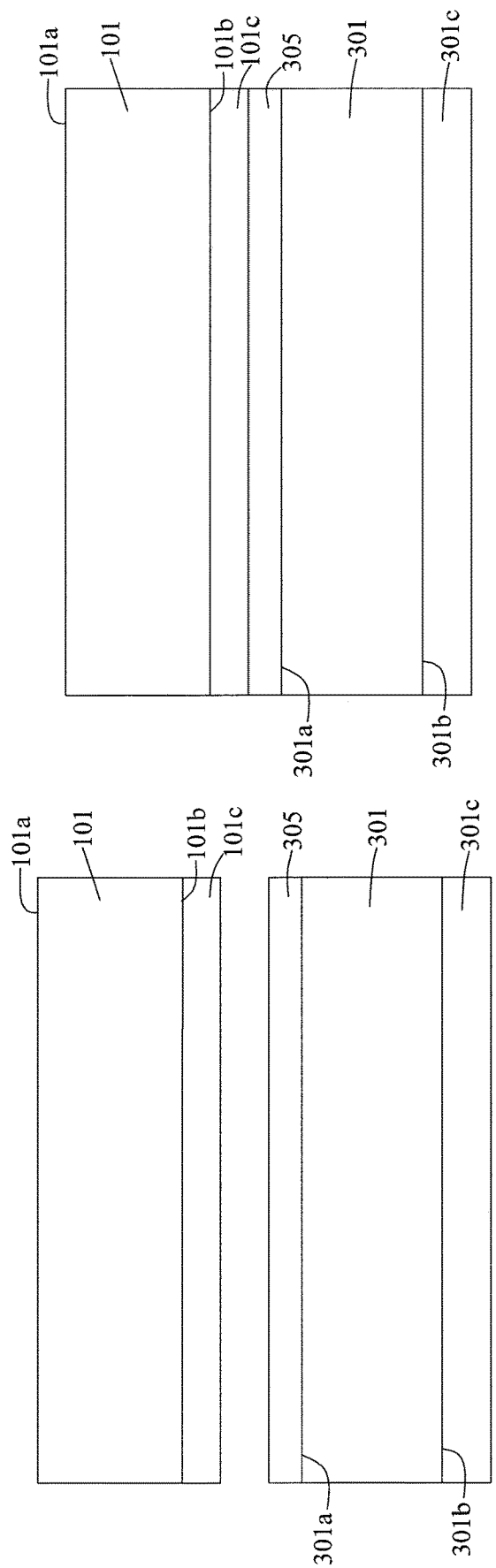
FIG. 8A is a schematic view of a first substrate and a second substrate in accordance with some embodiments of the present disclosure.
FIG. 8B is a schematic view of a first substrate bonded with a second substrate in accordance with some embodiments of the present disclosure.

In operation 801, a first substrate 101 and a second substrate 301 are received or provided as shown in FIG. 8A. In some embodiments, the first substrate 101 includes a first side 101a, a second side 101b and a device layer 101c. In some embodiments, the second substrate 301 includes a first side 301a, a second side 301b and a device layer 301c. In some embodiments, the first substrate 101 has similar or different configuration from the second substrate 301. In some embodiments, the first substrate 101 and the second substrate 301 have similar configuration as in FIG. 4. In some embodiments, a dielectric layer 305 is disposed over the first side 301a of the second substrate 301.

In operation 802, the first substrate 101 is bonded with the second substrate 301 as shown in FIG. 8B. In some embodiments, one side of the first substrate 101 is bonded with one side of the second substrate 301. In some embodiments, the first side 101a of the first substrate 101 is bonded with the second side 301b of the second substrate 301. In some embodiments, the second side 101b of the first substrate 101 is bonded with the first side 301a of the second substrate 301. In some embodiments, the dielectric layer 305 of the second substrate 301 is bonded with the second side 101b or the device layer 101c of the substrate 101. In some embodiments, the first substrate 101 and the second substrate 301 are bonded by any suitable operations such as direct bonding, oxide to oxide bonding, dielectric to dielectric bonding, etc.

In operation 803, a recess 101e is formed as shown in FIG. 8C or 8D. In some embodiments, the recess 101e passes through the first substrate 101 or the second substrate 301. In some embodiments, the recess 101e is formed by photolithography and etching operations. In some embodiments, some of the first substrate 101 or the second substrate 301 are removed to form the recess 101e. In some embodiments, some of the first substrate 101 are removed first as shown in FIG. 8C, and then some of the second substrate 301 are removed to form the recess 101e as shown in FIG. 8D. In some embodiments, the recess 101e is in a stepped or staggered configuration. In some embodiments, the recess 101e is extended between the first side 101a and the second side 101b of the substrate 101. In some embodiments, the recess 101e is extended between the first side 101a of the first substrate 101 and the second side 301b of the second substrate 301.

Figures 8E, 8F:
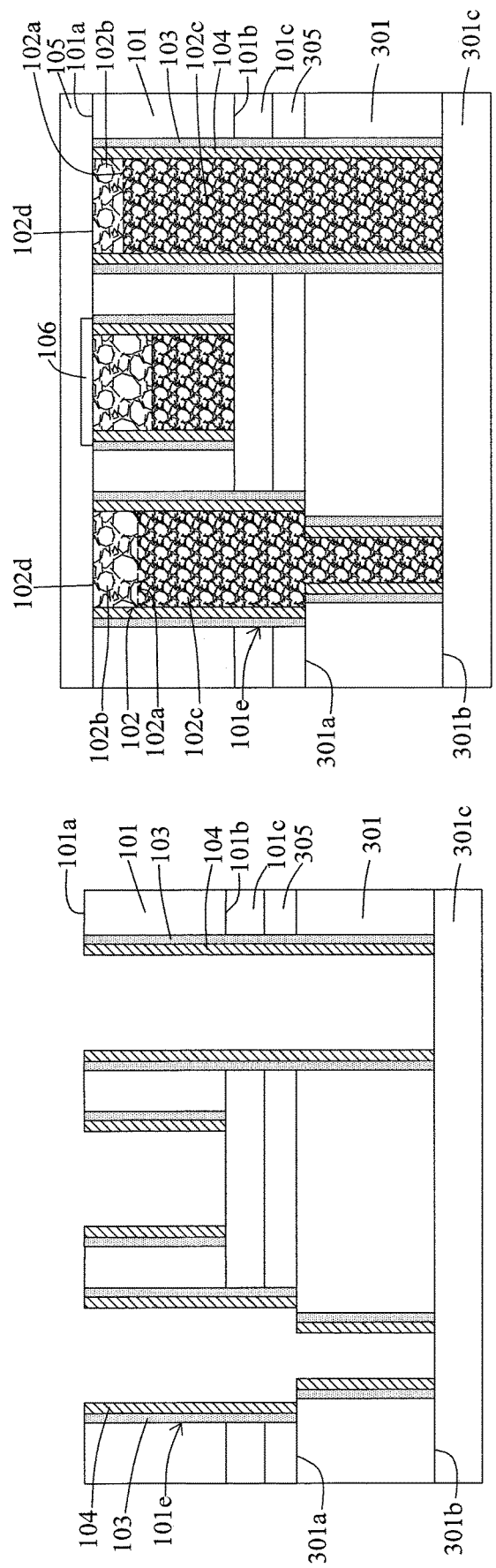
FIG. 8E is a schematic view of a first substrate and a second substrate with barrier layers and seed layers in accordance with some embodiments of the present disclosure.
FIG. 8F is a schematic view of a semiconductor structure with conductive vias in accordance with some embodiments of the present disclosure.

In operation 804, a barrier layer 103 or a seed layer 104 is disposed in the recess 101e as shown in FIG. 8E. In some embodiments, the barrier layer 103 or the seed layer 104 is disposed within the first substrate 101 or the second substrate 301. In some embodiments, the operation 804 is similar to the operation 703.

In operation 805, a conductive material is disposed in the recess 101e as shown in FIG. 8F. In some embodiments, the operation 805 is similar to the operation 704 or 603. In some embodiments, the conductive material such as copper is disposed in the recess 101e or on the seed layer 104 by electroplating operations. During the electroplating operations, different levels of currents (Y1, Y2, Y3, Y4) are applied to the substrate 101 at different stages (0 to X1, X1 to X2, X2 to X3, X3 to X4) of the electroplating. The pulse current Y3 intervenes between the first current Y2 and the second current Y4 as shown in FIG. 6D. After the electroplating operations, the conductive via 102 including an interface 102a, a first portion 102b and a second portion 102c is formed as shown in FIG. 8F. In some embodiments, the interface 102a is disposed in the first substrate 101.

In some embodiments, an average grain size of the first portion 102b is substantially different from an average grain size of the second portion 102c. In some embodiments, the average grain size of the first portion 102b is substantially greater than the average grain size of the second portion 102c. In some embodiments, the average grain size of the first portion 102b is substantially greater than about 300 nm, and the average grain size of the second portion 102c is substantially less than about 300 nm.

In some embodiments, a conductive pad 106 is disposed over the conductive via 102. In some embodiments, a dielectric layer 105 is disposed over the conductive via 102 and the first side 101a of the first substrate 101. In some embodiments, the first portion 102b has a substantially flat surface 102d. The flat surface 102d is substantially parallel to the first side 101a of the substrate 101. The dielectric layer 105 can be smoothly disposed on the conductive via 102 and the substrate 101. In some embodiments, the semiconductor structure 400 as in FIG. 4 is formed by the operations 801-805.

Figure 9:
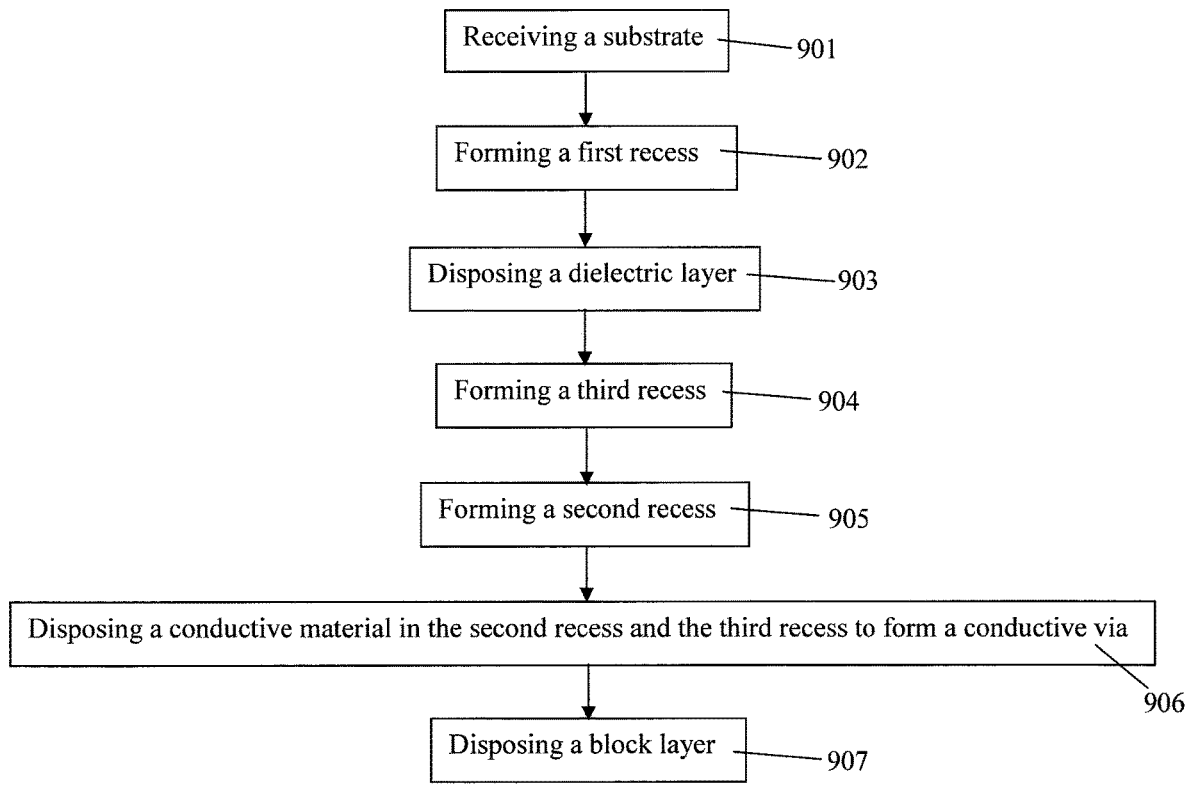
FIG. 9 is a flow diagram of a method of manufacturing a semiconductor structure in accordance with some embodiments of the present disclosure.

In some embodiments, a semiconductor structure is formed by a method 900. The method 900 includes a number of operations and the description and illustration are not deemed as a limitation as the sequence of the operations. FIG. 9 is an embodiment of a method 900 of manufacturing a semiconductor structure. The method 900 includes a number of operations (901, 902, 903, 904, 905, 906 and 907).

Figures 9A, 9B:
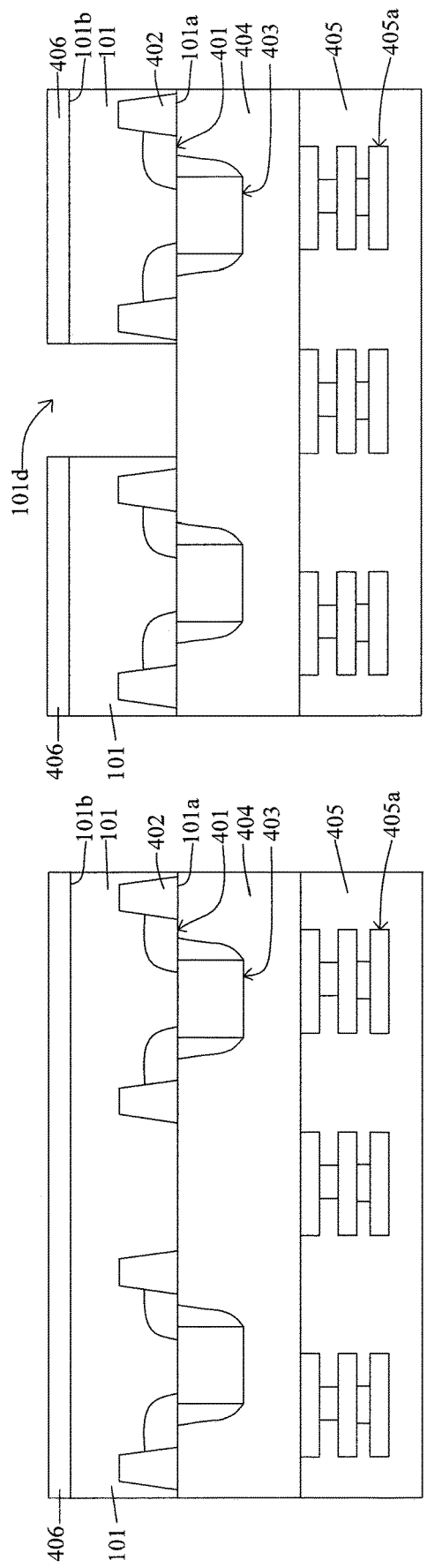
FIG. 9A is a schematic view of a substrate in accordance with some embodiments of the present disclosure.
FIG. 9B is a schematic view of a substrate with a recess in accordance with some embodiments of the present disclosure.

In operation 901, a substrate 101 is received or provided as shown in FIG. 9A. In some embodiments, the substrate 101 includes a first side 101a and a second side 101b. In some embodiments, a photodiode 401 and a metal gate 403 are disposed over the first side 101a of the substrate 101. In some embodiments, a shallow trench isolation (STI) 402 is disposed in the substrate 101. In some embodiments, a interlayer dielectric (ILD) 404 and an intermetallic dielectric (IMD) 405 are disposed over the first side 101a of the substrate 101. In some embodiments, a high dielectric constant (high k) dielectric layer 406 is disposed over the second side 101b of the substrate 101. In some embodiments, the high k dielectric layer 406 is disposed by chemical vapor deposition (CVD), physical vapor deposition (PVD), etc.

In operation 902, a first recess 101d is formed as shown in FIG. 9B. In some embodiments, the first recess 101d is formed by photolithography and etching operations. In some embodiments, the first recess 101d passes through the substrate 101 and the high k dielectric layer 406.

Figures 9C, 9D:
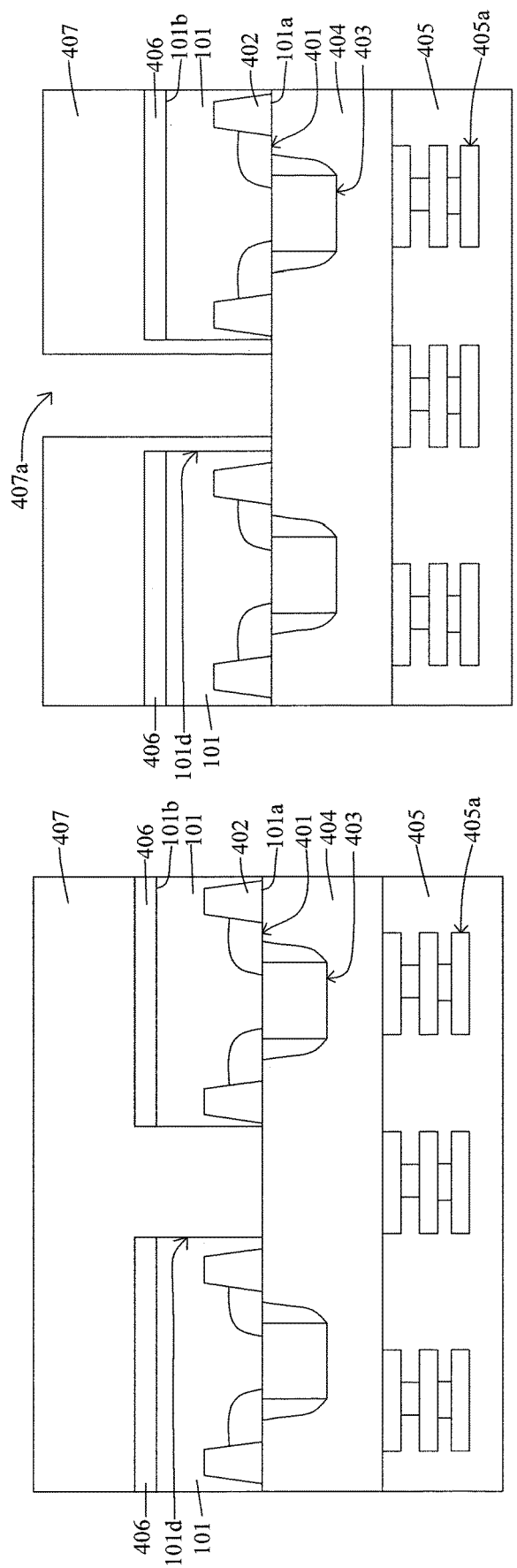
FIG. 9C is a schematic view of a substrate with a dielectric layer in accordance with some embodiments of the present disclosure.
FIG. 9D is a schematic view of a dielectric layer with a recess in accordance with some embodiments of the present disclosure.

In operation 903, a dielectric layer 407 is disposed over the second side 101b of the substrate 101 as shown in FIG. 9C. In some embodiments, the dielectric layer 407 is disposed on the high k dielectric layer 406 and in the first recess 101d. In some embodiments, the dielectric layer 407 includes oxide such as silicon oxide.

In operation 904, a third recess 407a is formed as shown in FIG. 9D. In some embodiments, the third recess 407a is formed by photolithography and etching operations. In some embodiments, the third recess 407a passes through the dielectric layer 407. In some embodiments, the third recess 407a is within the first recess 101d. In some embodiments, some of the dielectric layer 407 is disposed conformal to the first recess 101d.

Figure 9F:
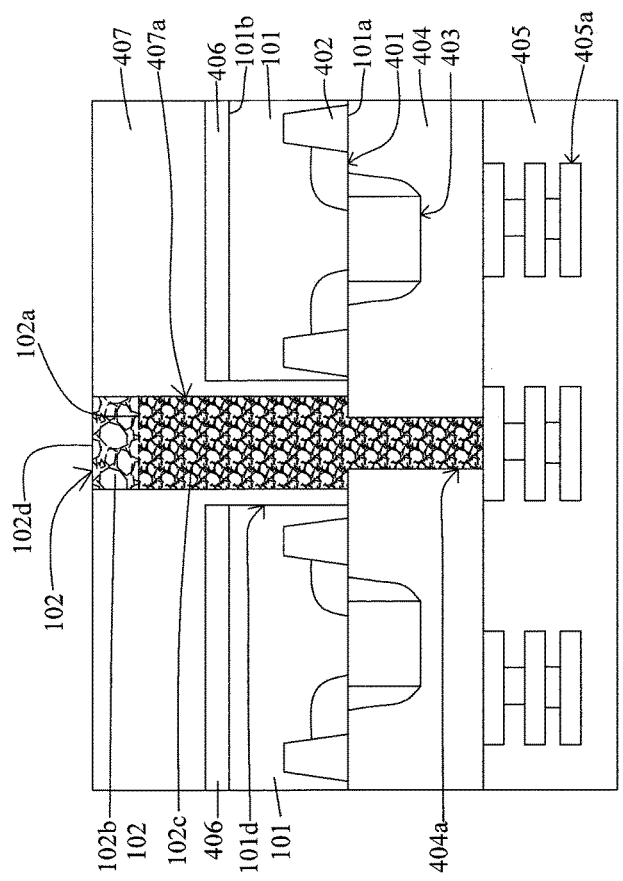
FIG. 9F is a schematic view of a conductive via in accordance with some embodiments of the present disclosure.
Figure 9E:
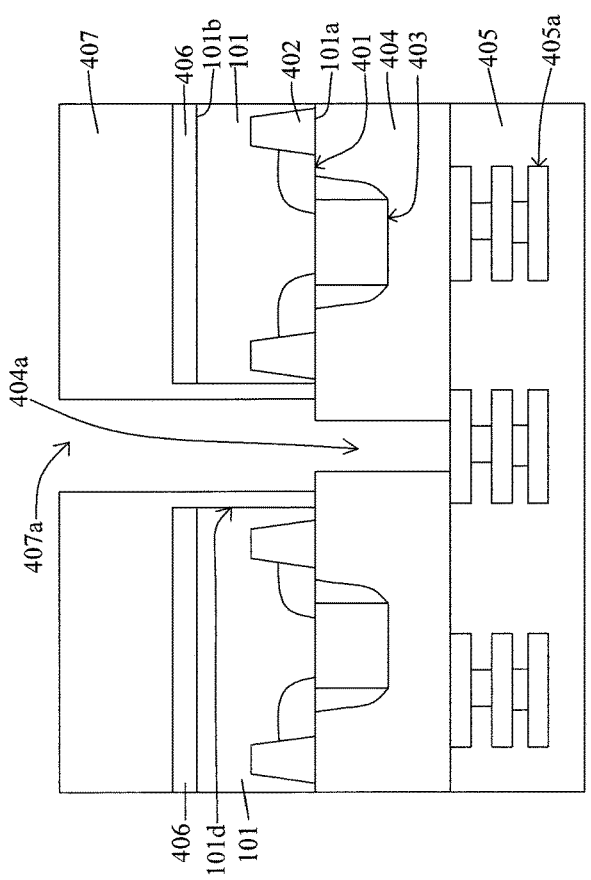
FIG. 9E is a schematic view of a substrate, a dielectric layer and an interlayer dielectric (ILD) with a recess in accordance with some embodiments of the present disclosure.

In operation 905, a second recess 404a is formed as shown in FIG. 9E. In some embodiments, the second recess 404a is formed by photolithography and etching operations. In some embodiments, the second recess 404a passes through the ILD 404. In some embodiments, the second recess 404a is coupled with the third recess 407a. In some embodiments, a width of the second recess 404a is substantially same as or different from a width of the third recess 407a. In some embodiments, a portion of a metallic structure 405a is exposed when the second recess 404a and the third recess 407a are formed.

In operation 906, a conductive material is disposed in the second recess 404a and the third recess 407a to form a conductive via 102 as shown in FIG. 9F. In some embodiments, the operation 906 is similar to the operation 805, 704 or 603. In some embodiments, the conductive material such as copper is disposed in the second recess 404a and the third recess 407a by electroplating operations. During the electroplating operations, different levels of currents (Y1, Y2, Y3, Y4) are applied to the substrate 101 at different stages (0 to X1, X1 to X2, X2 to X3, X3 to X4) of the electroplating. The pulse current Y3 intervenes between the first current Y2 and the second current Y4 as shown in FIG. 6D. After the electroplating operations, the conductive via 102 including an interface 102a, a first portion 102b and a second portion 102c is formed as shown in FIG. 9F. In some embodiments, the interface 102a is disposed in the dielectric layer 407.

In some embodiments, an average grain size of the first portion 102b is substantially different from an average grain size of the second portion 102c. In some embodiments, the average grain size of the first portion 102b is substantially greater than the average grain size of the second portion 102c. In some embodiments, the average grain size of the first portion 102b is substantially greater than about 300 nm, and the average grain size of the second portion 102c is substantially less than about 300 nm.

Figure 9G:
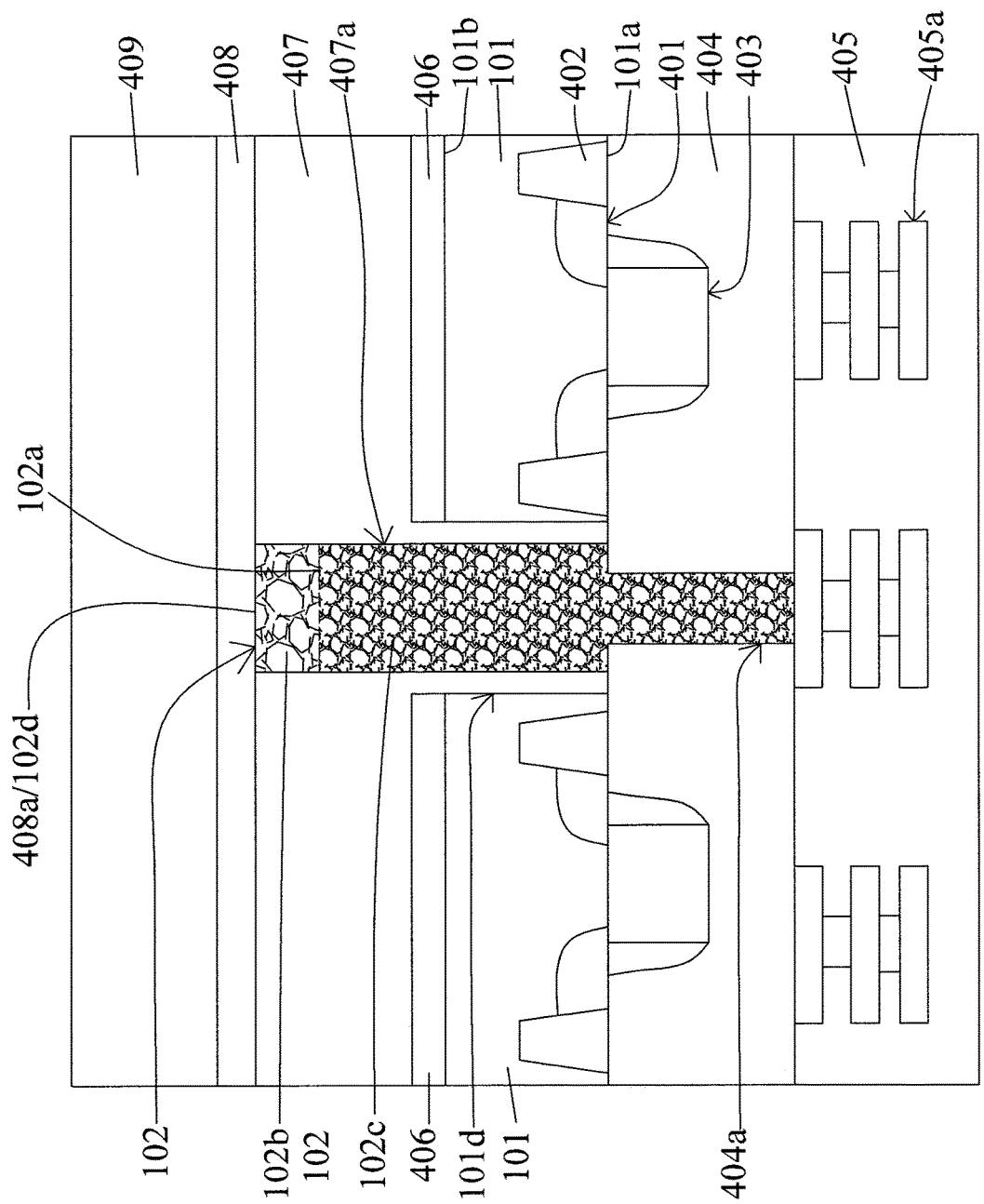
FIG. 9G is a schematic view of a semiconductor structure with a conductive via in accordance with some embodiments of the present disclosure.

In operation 907, a block layer 408 is disposed over the first portion 102b of the conductive via 102 and the dielectric layer 407 as shown in FIG. 9G. Since the first portion 102b has a substantially flat surface 102d, the block layer 408 can be smoothly disposed on the conductive via 102 and the dielectric layer 407. In some embodiments, the flat surface 102d is substantially parallel to the second side 101b of the substrate 101. In some embodiments, a second interface 408a is disposed between the first portion 102b of the conductive via 102 and the block layer 408. In some embodiments, the second interface 408a is substantially parallel to the second side 101b of the substrate 101.

In some embodiments, components 409 are disposed over the block layer 408. In some embodiments, the components 409 include metal grid, anti-reflective coating, color filters, microlens, etc. In some embodiments, the metal grid is disposed by any suitable operations such as CVD, sputtering, etc. In some embodiments, the anti-reflective coating and the color filters are disposed by spin coating, sputtering or any other suitable operations. In some embodiments, the microlens are formed by photolithography, reactive ion etching (RIE) or any other suitable operations. In some embodiments, the semiconductor structure 500 as in FIG. 5 is formed by the operations 901-907.

In some embodiments, a method of manufacturing a semiconductor structure includes receiving a substrate including a first side and a second side opposite to the first side; forming a recess extending between the first side and the second side; and disposing a conductive material in the recess to form a conductive via, wherein the conductive via includes an interface, a first portion adjacent to the first side and a second portion adjacent to the second side, the interface is disposed between the first portion and the second portion, an average grain size of the first portion is substantially different from an average grain size of the second portion.

In some embodiments, the method further includes disposing a barrier layer or a seed layer in the recess. In some embodiments, the disposing of the conductive material includes electroplating the conductive material in a first current, a second current and a pulse current intervening between the first current and the second current, the pulse current is substantially smaller than the first current and the second current. In some embodiments, the disposing of the conductive material includes electroplating the conductive material in a first current, a second current and a pulse current intervening between the first current and the second current, a duration of the pulse current is substantially less than a duration of the first current and a duration of the second current. In some embodiments, the conductive via is formed after self-annealing of the conductive material. In some embodiments, a height of the first portion is smaller than a height of the second portion. I some embodiments, the substrate further includes a device layer disposed on the second side. In some embodiments, the method further includes disposing a conductive pad over the first portion of the conductive via. In some embodiments, the method further includes disposing a dielectric layer over the first portion of the conductive via and the conductive pad.

In some embodiments, a method of manufacturing a semiconductor structure includes receiving a first substrate having a first side and a second side opposite to the first side and a second substrate having a third side and a fourth side opposite to the third side; bonding the second side of the first substrate and the third side of the second substrate; forming a recess extending from the first side of the first substrate to the second side of the first substrate or the fourth side of the second substrate; disposing a barrier layer or a seed layer in the recess; and disposing a conductive material in the recess to form a conductive via, wherein the conductive via includes an interface, a first portion adjacent to the first side of the first substrate and a second portion adjacent to the second side of the first substrate or the fourth side of the second substrate, the interface is disposed between the first portion and the second portion, and an average grain size of the first portion is substantially different from an average grain size of the second portion.

In some embodiments, the first substrate further includes first device layer disposed over the second side of the first substrate, and the second portion of the conductive via is adjacent to the second side of the first substrate and in contact with the first device layer. In some embodiments, the second substrate further includes a second device layer disposed over the fourth side of the second substrate, and the second portion of the conductive via is adjacent to the fourth side of the second substrate and in contact with the second device layer. In some embodiments, the disposing of the conductive material includes electroplating the conductive material in a first current, a second current and a pulse current intervening between the first current and the second current, the pulse current is substantially smaller than the first current and the second current. In some embodiments, the disposing of the conductive material includes electroplating the conductive material in a first current, a second current and a pulse current intervening between the first current and the second current, a duration of the pulse current is substantially less than a duration of the first current and a duration of the second current. In some embodiments, the conductive via is formed a after a self-annealing of the conductive material. In some embodiments, a height of the first portion is smaller than a height of the second portion.

In some embodiments, a method of manufacturing a semiconductor structure includes receiving a substrate having a first side and a second side opposite to the first side; forming a first recess in the substrate extending from the second side of the first side; disposing a dielectric layer over the second side to fill the first recess; forming a second recess passing through the dielectric layer; forming a third recess under the second recess, wherein the third recess is coupled to the second recess; and disposing a conductive material in the second recess and the third recess to form a conductive via, wherein the conductive via includes a first portion exposed through the dielectric layer, a second portion disposed in the dielectric layer, and an interface disposed between the first portion and the second portion, and an average grain size of the first portion is substantially different from an average grain size of the second portion.

In some embodiments, an interlayer dielectric (ILD) and an intermetallic dielectric (IMD) are disposed over the first side of the substrate, and a metallic structure is disposed in the IMD, wherein the second portion of the conductive via passes through the ILD and is in contact with a portion of the metallic structure. In some embodiments, a block layer is disposed over the first portion of the conductive via and the dielectric layer. In some embodiments, a height of the first portion is smaller than a height of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a substrate including a first side and a second side opposite to the first side, wherein the substrate comprises a device layer disposed on the second side;
   forming a recess extending between the first side and the second side;
   disposing a conductive material in the recess to form a conductive via; and
   disposing a conductive pad over the first side of the substrate;
   wherein the conductive via includes an interface, a first portion adjacent to the first side and a second portion adjacent to the second side, the interface is disposed between the first portion and the second portion, an average grain size of the first portion is substantially different from an average grain size of the second portion, a bottom of the conductive via is in contact with the device layer, and the conductive pad is in direct contact with the first portion of the conductive via.

2. The method of claim 1, further comprising disposing a barrier layer or a seed layer in the recess.

3. The method of claim 1, wherein the disposing of the conductive material includes electroplating the conductive material in a first current, a second current and a pulse current intervening between the first current and the second current, the pulse current is substantially smaller than the first current and the second current.

4. The method of claim 1, wherein the disposing of the conductive material includes electroplating the conductive material in a first current, a second current and a pulse current intervening between the first current and the second current, a duration of the pulse current is substantially less than a duration of the first current and a duration of the second current.

5. The method of claim 1, wherein the conductive via is formed after self-annealing of the conductive material.

6. The method of claim 1, wherein a height of the first portion is smaller than a height of the second portion.

7. The method of claim 1, further comprising disposing a dielectric layer over the first portion of the conductive via and the conductive pad.

8. A method of manufacturing a semiconductor structure, comprising:
   receiving a first substrate having a first side and a second side opposite to the first side and a second substrate having a third side and a fourth side opposite to the third side, wherein the first substrate comprises a first device layer disposed over the second side, and the second substrate comprises a dielectric layer over the third side and a second device layer disposed over the fourth side;
   bonding the first device layer to the dielectric layer, wherein the first device layer is in contact with the dielectric layer;
   forming a recess extending from the first side of the first substrate to the second side of the first substrate or the fourth side of the second substrate;
   disposing a barrier layer or a seed layer in the recess; and
   disposing a conductive material in the recess to form a conductive via,
   wherein the conductive via includes an interface, a first portion adjacent to the first side of the first substrate and a second portion adjacent to the second side of the first substrate or the fourth side of the second substrate, the interface is disposed between the first portion and the second portion, an average grain size of the first portion is substantially different from an average grain size of the second portion, and a bottom of the conductive via is in contact with the first device layer or with the second device layer.

9. The method of claim 8, wherein the second portion of the conductive via is adjacent to the second side of the first substrate and in contact with the first device layer.

10. The method of claim 8, wherein the second portion of the conductive via is adjacent to the fourth side of the second substrate and in contact with the second device layer.

11. The method of claim 8, wherein the disposing of the conductive material includes electroplating the conductive material in a first current, a second current and a pulse current intervening between the first current and the second current, the pulse current is substantially smaller than the first current and the second current.

12. The method of claim 8, wherein the disposing of the conductive material includes electroplating the conductive material in a first current, a second current and a pulse current intervening between the first current and the second current, a duration of the pulse current is substantially less than a duration of the first current and a duration of the second current.

13. The method of claim 8, wherein the conductive via is formed after self-annealing of the conductive material.

14. The method of claim 8, wherein a height of the first portion is smaller than a height of the second portion.

15. A method of manufacturing a semiconductor structure, comprising:
receiving a substrate having a first side and a second side opposite to the first side;
forming a first recess in the substrate extending from the second side to the first side;
disposing a dielectric layer over the second side to fill the first recess;
forming a second recess passing through the dielectric layer;
forming a third recess under the second recess, wherein the third recess is coupled to the second recess; and
disposing a conductive material in the second recess and the third recess to form a conductive via,
wherein the conductive via comprises a first portion exposed through the dielectric layer, a second portion disposed in the dielectric layer, and an interface disposed between the first portion and the second portion, and an average grain size of the first portion is substantially different from an average grain size of the second portion.

16. The method of claim 15, further comprising an interlayer dielectric (ILD) and an intermetallic dielectric (IMD) disposed over the first side of the substrate, and a metallic structure disposed in the IMD, wherein the second portion of the conductive via passes through the ILD and is in contact with a portion of the metallic structure.

17. The method of claim 15, further comprising disposing a block layer over the first portion of the conductive via and the dielectric layer.

18. The method of claim 15, wherein a height of the first portion is smaller than a height of the second portion.

19. The method of claim 1, wherein the device layer is exposed through a bottom of the recess.

20. The method of claim 8, further comprising forming a conductive pad over the first side of the first substrate.

* * * * *